US010686007B2

(12) United States Patent
George et al.

(10) Patent No.: US 10,686,007 B2
(45) Date of Patent: Jun. 16, 2020

(54) QUANTUM CIRCUIT ASSEMBLIES WITH AT LEAST PARTIALLY BURIED TRANSMISSION LINES AND CAPACITORS

(71) Applicant: Intel Corporation, Santa Clara, CA (US)

(72) Inventors: Hubert C. George, Portland, OR (US); Adel A. Elsherbini, Chandler, AZ (US); Lester Lampert, Portland, OR (US); James S. Clarke, Portland, OR (US); Ravi Pillarisetty, Portland, OR (US); Zachary R. Yoscovits, Beaverton, OR (US); Nicole K. Thomas, Portland, OR (US); Roman Caudillo, Portland, OR (US); Kanwaljit Singh, Rotterdam (NL); David J. Michalak, Portland, OR (US); Jeanette M. Roberts, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/012,815

(22) Filed: Jun. 20, 2018

(65) Prior Publication Data

US 2019/0043919 A1    Feb. 7, 2019

(51) Int. Cl.
*H01L 27/18*    (2006.01)
*H01L 39/22*    (2006.01)
(Continued)

(52) U.S. Cl.
CPC ............ *H01L 27/18* (2013.01); *G06N 10/00* (2019.01); *H01L 28/10* (2013.01); *H01L 28/40* (2013.01);
(Continued)

(58) Field of Classification Search
CPC ....... H01L 27/18; H01L 39/223; H01L 28/10; H01L 28/40; H01L 39/025; H01L 39/2493
See application file for complete search history.

(56) References Cited

U.S. PATENT DOCUMENTS 10,068,184 B1 *    9/2018    Hertzberg ............ H01L 39/223
2016/0322693 A1    11/2016    Chang et al.
(Continued)

FOREIGN PATENT DOCUMENTS

| WO | 2017-131831 | 9/2017 |
|---|---|---|
| WO | 2017-155531 | 9/2017 |
| WO | 2019117973 A1 | 6/2019 |

OTHER PUBLICATIONS

"Independent, extensible control of same-frequency superconducting qubits by selective broadcasting," Asaad et al., Netherlands Organisation for Applied Scientific Research, Aug. 28, 2015, 17 pages.
(Continued)

*Primary Examiner* — Ermias T Woldegeorgis
(74) *Attorney, Agent, or Firm* — Patent Capital Group

(57) ABSTRACT

Embodiments of the present disclosure propose quantum circuit assemblies with transmission lines and/or capacitors that include layer-conductors oriented perpendicular to a substrate (i.e. oriented vertically) or a qubit die, with at least portions of the vertical layer-conductors being at least partially buried in the substrate. Such layer-conductors may form ground and signal planes of transmission lines or capacitor plates of capacitors of various quantum circuit assemblies.

25 Claims, 14 Drawing Sheets

(51) Int. Cl.
| | |
|---|---|
| *H01L 49/02* | (2006.01) |
| *G06N 10/00* | (2019.01) |
| *H01L 39/02* | (2006.01) |
| *H01L 39/24* | (2006.01) |
| *H03K 19/195* | (2006.01) |

(52) U.S. Cl.
CPC .......... *H01L 39/025* (2013.01); *H01L 39/223* (2013.01); *H01L 39/2493* (2013.01); *H03K 19/195* (2013.01)

(56) References Cited

U.S. PATENT DOCUMENTS

| | | |
|---|---|---|
| 2017/0091649 A1 | 3/2017 | Clarke et al. |
| 2017/0148972 A1 | 5/2017 | Thompson et al. |
| 2018/0013052 A1* | 1/2018 | Oliver ................. H01L 25/0657 |

OTHER PUBLICATIONS

"Multilayer microwave integrated quantum circuits for scalable quantum computing," Brecht et al, Department of Applied Physics, Yale University, Sep. 4, 2015, 5 pages.

"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands; Feb. 16, 2015, 9 pages.

"Surface loss simulations of superconducting coplanar waveguide resonators," Wenner et al, Applied Physics Letters 99, 113513 (2011), pp. 113513-1 through 3.

"Magnetic field tuning of coplanar waveguide resonators," Healey, et al., Applied Physics Letters 93, 043513 (2008), pp. 043513-1 through 3 (4 pages with cover sheet).

"Embracing the quantum limit in silicon computing," Morton et al, Macmillan Publishers, Nov. 17, 2011, vol. 479, Nature, pp. 345-353.

"Scalable quantum circuit and control for a superconducting surface code," Versluis et al, Netherlands Organisation for Applied Scientific Research, Dec. 28, 2016, 9 pages.

"Suspending superconducting qubits by silicon micromachining," Chu et al., Department of Applied Physics, Yale University, Jun. 10, 2016, 10 pages.

"Detecting bit-flip errors in a logical qubit using stabilizer measurements," Riste et al., QuTech and Kavli Institute of Nanoscience, Delft University of Technology, The Netherlands; 12 pages; Nov. 21, 2014.

International Search Report and Written Opinion issued for PCT/US2017/066889 on Sep. 17, 2018; 15 pages.

* cited by examiner

US 10,686,007 B2

QUANTUM CIRCUIT ASSEMBLIES WITH AT LEAST PARTIALLY BURIED TRANSMISSION LINES AND CAPACITORS

TECHNICAL FIELD

This disclosure relates generally to the field of quantum computing, and more specifically, to transmission line structures and capacitors of quantum circuit assemblies, and to methods of fabrication thereof.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Designing and manufacturing quantum circuits is a non-trivial task because the unique quantum mechanical phenomena in such circuits lead to unique considerations which never had to be dealt with in classical, non-quantum, circuits, e.g., taking precautions in protecting qubits from decoherence so that they can stay in their information-holding states long enough to perform the necessary calculations and read out the results, and ability to operate at cryogenic temperatures. That is why, compared to well-established and thoroughly researched classical computers, quantum computing is still in its infancy, with the highest number of qubits in a solid-state quantum processor currently being below 100 and with the current manufacturing approaches being far from those which could be used in large-scale manufacturing. As the applications needing quantum circuits grow, the need for quantum circuit assemblies having improved performance and manufactured using existing process tools of leading-edge device manufacturers also grows.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
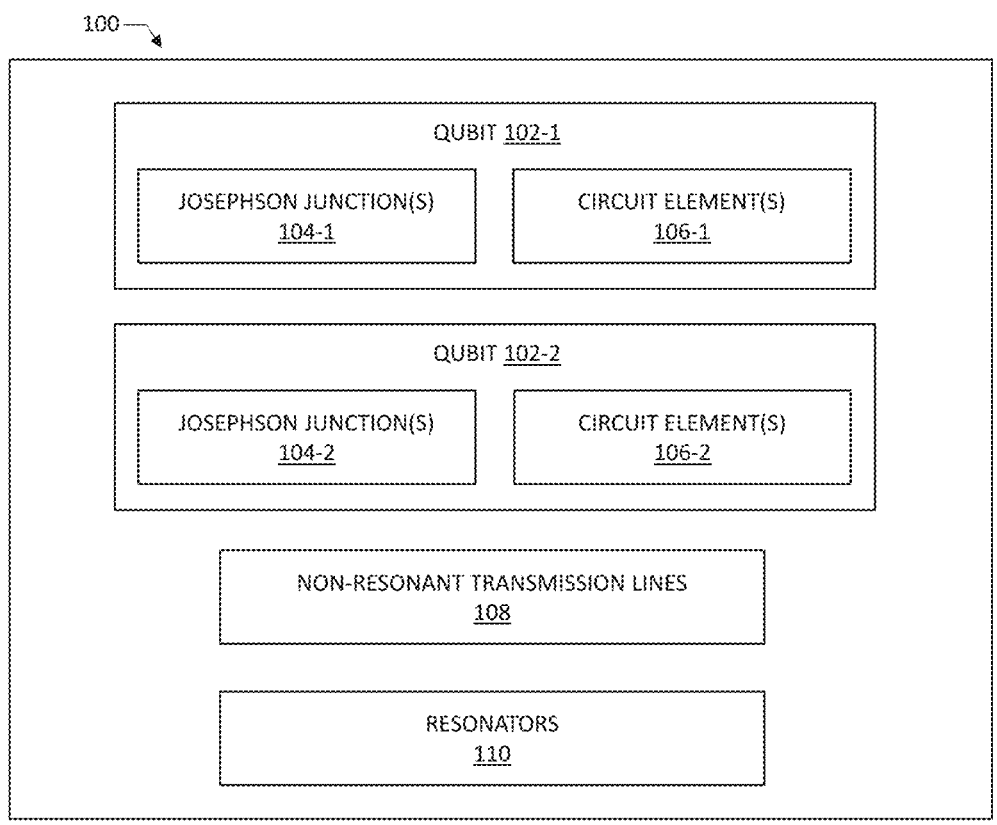
FIG. 1 provides a schematic illustration of a quantum circuit assembly that may include buried transmission lines or/and capacitors, according to one embodiment of the present disclosure.

As briefly described above, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its entanglement with other particles. These unique phenomena make manipulation of data in quantum computers significantly different from that of classical computers (i.e. computers that use phenomena of classical physics). Therefore, both the industry and the academics continue to focus on a search for new and improved physical systems whose functionality could approach that expected of theoretically designed qubits. Physical systems for implementing qubits that have been explored until now include e.g., superconducting qubits (e.g., transmon qubits or simply "transmons"), semiconducting qubits including those made using quantum dots (e.g., spin qubits and charge qubits), photon polarization qubits, single trapped ion qubits, etc.

Quantum circuits based on various physical systems for implementing qubits typically implement two fundamental types of components. One type of components includes transmission line structures, while the other type includes various coupling components, e.g., capacitors, for capacitively coupling various elements of a quantum circuit to one another.

Transmission line structures (interchangeably referred to in the following simply as "transmission lines") come into play in that quantum circuits based on various physical systems for implementing qubits use microwaves to control the qubits, for example to initialize, manipulate (e.g., couple), and readout the qubits. The microwaves are generally delivered and supported using transmission line structures, which explains why transmission line structures can be seen as a fundamental type of components of various quantum circuits. In particular, microwave transmission lines used in quantum circuits can be either resonant (sometimes referred to as "resonators") or non-resonant, sometimes referred to, together, as "microwave elements." In order to provide substantially lossless connectivity to, from, and between the qubits, electrically conductive portions of such microwave elements are typically made from superconducting materials. Conventionally, microwave transmission lines in quantum circuits have been implemented as coplanar waveguides (CPWs), with the ground planes of the CPWs being provided in the plane of qubits, i.e. horizontally or, phrased differently, with the ground planes of such microwave transmission lines being substantially parallel to the plane of the substrate or qubit die.

Capacitors is another fundamental type of components of various quantum circuits because they allow coupling various qubits with one another or coupling various portions of a single qubit with one another. Similar to conventional microwave transmission lines, capacitors in quantum circuits have been conventionally implemented with their capacitor plates being provided in the plane of qubits, i.e. horizontally or, phrased differently, with the capacitor plates being substantially parallel to the plane of the substrate or qubit die.

When used in quantum circuits, employing a conventional CPW architecture to implement various transmission lines, or employing a conventional capacitor architecture with capacitors being provided in the plane of qubits, may have various drawbacks. Therefore, one portion of the present disclosure relates to new transmission line structures for use as resonators, as well as for use as non-resonant transmission lines, in quantum circuits. Another portion of the present disclosure relates to capacitors, or, more generally, coupling components, also for use in quantum circuits. Fabrication techniques for forming/manufacturing various transmission line structures (both resonant and non-resonant) and capacitors described herein are also disclosed. In various aspects of the present disclosure, quantum circuit assemblies described herein include at least one transmission line or/and at least one capacitor that include layer-conductors oriented substantially vertically with respect to, i.e. substantially perpendicular to, the plane of a substrate on which at least one qubit, typically a plurality of qubits, is/are provided (such a substrate with one or more qubits provided thereon is commonly referred to as a "qubit die"). Moreover, in various aspects of the present disclosure, at least portions of such vertical layer-conductors are at least partially extend into the upper layers of the substrate, i.e. are at least partially buried in the substrate. Such layer-conductors may form ground and signal planes of transmission lines or/and opposite capacitor plates of capacitors of various quantum circuit assemblies.

In some embodiments, at least portions of vertical layer-conductors described herein may be arranged in a parallel-plate architecture, with the layer-conductors being conductor plates substantially parallel to one another and separated by a gap, and being substantially perpendicular to, and at least partially buried in, the substrate. In other embodiments, the vertical layer-conductors may have shapes which curve, i.e. they are not in two parallel planes, but the layer-conductors may be arranged so that their shapes are conformal to one another (i.e. at substantially all points, the distance between the two vertical layer-conductors it substantially the same). As used herein, the term "layer" in context of a "layer-conductor" is used to only refer to the fact that a conductor has larger, typically much larger, dimensions along two axes of an example coordinate system with 3 axes than a dimension along the third axis. Such a "layer-conductor" may also be referred to as a "planar conductor" where the term "planar" does not imply that a conductor is shaped as a plane, although in some embodiments it may. Thus, in general, although in some embodiments a "layer-conductor" as described herein may be shaped substantially as a plane, in other embodiments, a "layer-conductor" may include curves, turns, and/or wiggles in its shape. In general, a conductor is described herein as a "layer-conductor" if its length and width is substantially greater than its thickness. A conductor is described herein as "vertical" if its width is measured in a direction substantially perpendicular to the substrate.

Quantum circuit assemblies implementing at least partially buried vertical transmission lines and/or capacitors as described herein may provide significant advantages in terms of e.g., reducing losses and increasing coherence times of qubit devices. For example, losses which lead to qubit decoherence may be kept sufficiently low due to the presence of a gap between one layer-conductor forming a ground plane and another layer-conductor forming a signal line of a transmission line in a quantum circuit assembly. In particular, presence of an open gap between the signal plane and the ground plane of a vertical transmission line may allow reducing spurious (i.e. unintentional and undesirable) two-level systems (TLSs), thought to be a dominant source of qubit decoherence, where, in general, as used in quantum mechanics, a two-level (also referred to as "two-state") system is a system that can exist in any quantum superposition of two independent and physically distinguishable quantum states. Furthermore, implementing transmission lines with vertical parallel-plate ground planes or implementing capacitors with vertical parallel-plate capacitor electrodes (interchangeably referred to herein as "capacitor plates") as described herein may advantageously facilitate use of three-dimensional (3D) and stacked designs for quantum circuit assemblies and may be suitable for device scalability since qubit device area is reduced. Still further, structures described herein are particularly compatible to 300-millimeter fabrication processes.

In context of the present disclosure, unless specified otherwise, structures referred to as "buried" include structures that may either be partially buried (i.e. with only a portion extending into the substrate) or completely buried (i.e. where an the entire structure is provided in an opening in the substrate). Furthermore, the term "substrate" may include not only substrates as such but also various dielectric layers provided over e.g., commercially available substrates, e.g., interconnect support layers provided over substrates, epitaxially grown semiconductor materials grown over commercially available substrates, etc. Still further, as used herein, the term "gap" refers to a separation or an opening between two layer-conductors, which opening may include air or some other gas or combination of gasses, may be a substantially vacuum opening, or may include some solid or liquid dielectric medium.

In general, buried transmission line structures as described herein could be used in quantum circuit assemblies for providing microwave connectivity to, from, or/and between the qubits, or to set the frequencies that address individual qubits, and may be implemented as non-resonant or resonant transmission lines. Buried capacitors as described herein could be used in quantum circuit assemblies for coupling different qubits to one another, or/and coupling different portions of a single qubit to one another (e.g., if used to implement shunt capacitors of qubits).

In order to provide substantially lossless connectivity to, from, and between the qubits, some or all of the electrically conductive portions of quantum circuit assemblies described herein, in particular at least partially buried vertical layer-conductors implementing signal conductors, ground planes, or capacitor electrodes/plates, may be made from one or more superconducting materials. However, some or all of these electrically conductive portions could be made from electrically conductive materials which are not superconducting. In the following, unless specified otherwise, reference to an electrically conductive material implies that a superconducting material can be used, and vice versa. Furthermore, materials described herein as "superconducting/superconductive materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

While some descriptions are provided with reference to superconducting qubits, in particular to transmons, a particular class of superconducting qubits, or to spin qubits, at least some teachings of the present disclosure may be applicable to quantum circuit assembly implementations of any qubits, including superconducting qubits other than transmons and/or including qubits other than superconducting or spin qubits, which may employ at least partially buried vertical layer-conductors implementing signal conductors, ground planes, or capacitor electrodes/plates as described herein, all of which implementations are within the scope of the present disclosure. For example, the transmission lines described herein may be used in hybrid semiconducting-superconducting quantum circuit assemblies.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Furthermore, as used herein, terms indicating what may be considered an idealized behavior, e.g., "lossless" (or "low-loss") or "superconducting," are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-30 GHz, e.g., in 3-10 GHz range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Use of Transmission Lines and Capacitors in Quantum Circuit Assemblies

For purposes of illustrating certain example buried transmission lines and capacitors described herein, it is important to understand in general how these elements may be used in various quantum circuit assemblies. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 provides a schematic illustration of a quantum circuit assembly 100 that may include buried transmission lines or/and capacitors, according to one embodiment of the present disclosure. For illustrative purposes, the quantum circuit assembly 100 is an example of a superconducting quantum circuit that may include any of the buried transmission lines or/and capacitors described herein.

As shown in FIG. 1, an example quantum circuit assembly 100 may include two or more qubits 102, e.g., superconducting qubits, where, in the present FIGS., reference numerals following after a dash, e.g., qubit 102-1 and 102-2 indicate different instances of the same or analogous element. Each of the qubits 102 may include one or more non-linear inductive elements (e.g., Josephson Junctions) 104. Josephson Junctions are integral building blocks in superconducting quantum circuits where they form the basis of quantum circuit elements that can approximate functionality of theoretically designed qubits. In general, a Josephson Junction includes two superconductors coupled by a so-called weak link that weakens the superconductivity between the two superconductors. In quantum circuits, a weak link of a Josephson Junction may e.g., be implemented by providing a thin layer of an insulating, non-superconductive metal, or a semiconducting material, typically referred to as a "barrier" or a "tunnel barrier," sandwiched, in a stack-like arrangement, between two layers of superconductor, which two superconductors serve as a first and a second electrode of a Josephson Junction. The Josephson Junction provides a non-linear inductive element to the circuit and allows the qubit to become an anharmonic oscillator. The anharmonicity is determined by the ratio of the charging energy, which stems from the total capacitance between a first and second element of the qubit, and the Josephson energy of the non-linear inductive element (e.g., Josephson Junction). The anharmonicity is what allows the state of the qubit to be controlled to a high level of fidelity. In addition to controlling the anharmonicity, the charging and Josephson energies also control the qubit frequency.

Typically, when a qubit employs only one Josephson Junction, a frequency of the qubit cannot be changed substantially beyond what is defined by the design unless one of the qubit capacitive elements is tunable. Employing two or more Josephson Junctions, e.g., arranged in a so-called superconducting quantum interference device (SQUID), allows controlling the frequency of the qubit, which, in turn, allows greater control as to whether and when the qubit interacts with other components of a quantum circuit, e.g., with other qubits. In general, a SQUID of a superconducting qubit includes a pair of Josephson Junctions and a loop of a conductive, typically superconductive material (i.e. a superconducting loop), connecting a pair of Josephson Junctions. Applying a net magnetic field in a certain orientation to the SQUID loop of a superconducting qubit allows controlling the frequency of the qubit. In particular, applying magnetic field to the SQUID region of a superconducting qubit is generally referred to as a "flux control" of a qubit, and the magnetic field is generated by providing direct-current (DC) and/or a relatively low-frequency, typically below 1 GHz, current through an electrically conductive or superconductive line generally referred to as a "flux bias line" (also known as a "flux line" or a "flux coil line"). By providing flux bias lines sufficiently close to SQUIDs, magnetic fields generated as a result of currents running through the flux bias lines extend to the SQUIDs, thus tuning qubit frequencies.

Turning back to FIG. 1, within each qubit 102, the one or more Josephson Junctions 104 may be directly electrically connected to one or more other circuit elements 106, which, in combination with the Josephson Junction(s) 104, form a non-linear oscillator circuit providing multi-level quantum system where the first two to three levels define the qubit under normal operation. The circuit elements 106 could e.g., include shunt capacitors (i.e. capacitors connected in electrical parallel to non-linear inductive elements such as Josephson Junctions), superconducting loops of a SQUID, and electrodes for setting an overall capacitance of a qubit. The circuit elements 106 could also include ports for capacitively coupling the qubit to one or more of a readout resonator, a coupling or "bus" component, and a direct microwave drive line, or/and ports for electromagnetically coupling the qubit to a flux bias line.

As also shown in FIG. 1, an example quantum circuit assembly 100 may include a plurality of non-resonant transmission lines 108, and, in some cases, a plurality of resonators 110.

The non-resonant transmission lines 108 are typically used for providing microwave signals to different quantum circuit elements and components, which elements and components include e.g., readout resonators for various qubits, and may be considered to implement external readout and/or control of qubits. For example, for superconducting qubits, examples of the non-resonant transmission lines 108 include flux bias lines, microwave lines, and drive lines. In another example, for quantum dot qubits, examples of the non-resonant transmission lines 108 include lines that may control microwave pulses applied to gates and/or the doped regions of quantum dot device(s) in order to control spins of charge carriers in quantum dots formed in such device(s) or microwave pulses transmitted over a conductive pathway to induce a magnetic field in magnet line(s) of quantum dot devices.

On the other hand, the resonators 110 may be viewed as implementing internal control lines for qubits. For superconducting qubits, examples of the resonators 110 include coupling and readout resonators.

In general, a resonator 110 of a quantum circuit differs from a non-resonant microwave transmission line 108 in that a resonator is deliberately designed to support resonant oscillations (i.e. resonance), under certain conditions. In contrast, non-resonant transmission lines may be similar to conventional microwave transmission lines in that they are designed to avoid resonances, especially resonances at frequencies/wavelengths close to the resonant frequencies/wavelengths of any resonant object used in the quantum computing circuits, e.g., qubits, bus resonators, or readout resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible.

On-chip capacitive coupling between quantum or control elements can be achieved either through use of coupling components such as a coupling component on a neighboring qubit, a lumped element capacitor, a lumped element resonator, or a transmission line segment. A resonator is a transmission line segment that is made by employing fixed boundary conditions, and these boundary conditions control the frequencies/wavelengths which will resonate within a given transmission line segment used to implement a resonator. In order to satisfy boundary conditions for resonance, each end of a transmission line segment resonator can be either a node, if it is shorted to ground (e.g., where one end of the transmission line segment structure is electrically connected to a ground plane), or an antinode, if it is capacitively or inductively coupled to ground or to another quantum circuit element. Thus, resonators 110 differ from non-resonant microwave transmission lines 108 in how these lines are terminated at the relevant ends. A line used to route a signal on a substrate, i.e. one of the non-resonant transmission lines 108, typically extends from a specific source, e.g., a bonding pad or another type of electrical connection to a source, to a specific load (e.g., a short circuit proximate to SQUID loop, a quantum dot device, another bonding pad, or another electrical connection to a load). In other words, non-resonant transmission lines 108 terminate with electrical connections to sources, ground sinks, and/or loads. On the other hand, a transmission line resonator is typically composed of a piece of transmission line terminated with either two open circuits (in case of a half-wavelength resonator) or an open and a short circuit (in case of a quarter-wavelength resonator). In this case, for a desired resonant frequency, transmission line length may e.g., be a multiple of a microwave wavelength divided by 2 or 4, respectively. However, other terminations are possible, for example capacitive or inductive, and in this case the required line length to support resonance will be different from that identified above. For example, capacitive terminations may be used for resonators which are coupled to qubits, to a feedline, line, or to another resonator by a capacitive interaction.

Besides line termination by capacitive or inductive coupling or a short circuit, in order to support resonant oscillations, transmission line segments of the resonators 110 need to be of a specific length that can support such oscillations. That is why, often times, resonators 110 may be laid out on a substrate longer than the actual distance would require (i.e. a non-resonant transmission line would typically be laid out to cover the distance in the most compact manner possible, e.g., without any curves, wiggles, or excess length, while a resonator may need to have curves, wiggles, and be longer than the shortest distance between the two elements the resonator is supposed to couple in order to be sufficiently long to support resonance).

One type of the resonators 110 used with superconducting qubits are so-called coupling resonators (also known as "bus resonators"), which provide one manner for coupling different qubits together in order to realize quantum logic gates. These types of resonators are analogous in concept and have analogous underlying physics as readout resonators, except that a coupling or "bus" resonator involves only capacitive couplings between two or more qubits whereas a readout resonator involves capacitive coupling between two or more qubits and a feedline. A coupling resonator may be implemented as a microwave transmission line segment that includes capacitive or inductive connections to ground on both sides (e.g., a half-wavelength resonator), which results in oscillations (resonance) within the transmission line. While the ends of a coupling resonator have open circuits to the ground, each side of a coupling resonator is coupled, either capacitively or inductively, to a respective (i.e. different) qubit by being in the appropriate location and sufficient proximity to the qubit. Because different regions of a coupling resonator have coupling with a respective different qubit, the two qubits are coupled together through the coupling resonator. Thus, coupling resonators may be employed for implementing logic gates.

Another type of the resonators 110 used with superconducting qubits are so-called readout resonators, which may be used to read the state(s) of qubits. In some embodiments, a corresponding readout resonator may be provided for each qubit. A readout resonator, similar to the bus coupling resonator, is a transmission line segment. On one end it may have an open circuit connection to ground as well as any capacitively or inductively coupled connections to other quantum elements or a non-resonant microwave feedline. On the other end, a readout resonator may either have a capacitive connection to ground (for a half-wavelength resonator) or may have a short circuit to the ground (for a quarter-wavelength resonator), which also results in oscillations within the transmission line, with the resonant frequency of the oscillations being close to the frequency of the qubit. A readout resonator is coupled to a qubit by being in the appropriate location and sufficient proximity to the qubit, again, either through capacitive or inductive coupling. Due to a coupling between a readout resonator and a qubit, changes in the state of the qubit result in changes of the resonant frequency of the readout resonator. In turn, changes in the resonant frequency of the readout resonator can be read externally via connections which lead to external electronics e.g., wire or solder bonding pads.

For the non-resonant transmission lines 108, some descriptions of flux bias lines were provided above and, in the interests of brevity are not repeated here. In general, running a current through a flux bias line, provided e.g., from a wirebonding pads, solder bump, mechanical connector, or any other connection element, allows tuning (i.e. changing) the frequency of a corresponding qubit 102 to which a given flux bias line is connected. As a result of running the current in a given flux bias line, magnetic field is created around the line. If such a magnetic field is in sufficient proximity to a given qubit 102, e.g., by a portion of the flux bias line being provided next (sufficiently close) to the qubit 102, the magnetic field couples to the qubit, thereby changing the spacing between the energy levels of the qubit. This, in turn, changes the frequency of the qubit since the frequency is directly related to the spacing between the energy levels via the equation E=hv (Planck's equation), where E is the energy (in this case the energy difference between energy levels of a qubit), h is the Planck's constant and v is the frequency (in this case the frequency of the qubit). As this equation illustrates, if E changes, then v changes. Different currents and pulses of currents can be sent down each of the flux lines allowing for independent tuning of the various qubits.

Typically, the qubit frequency may be controlled in order to bring the frequency either closer to or further away from another resonant item, for example a coupling resonator or a coupled neighbor qubit, to implement multi-qubit interactions, as may be desired in a particular setting.

For example, if it is desirable that a first qubit 102-1 and a second qubit 102-2 interact, via a coupling resonator (i.e. an example of the resonators 110) connecting these qubits, then both qubits 102 may need to be tuned to be at nearly the same frequency or a detuning equal, or nearly equal, to the anharmonicity. One way in which such two qubits could interact is that, if the frequency of the first qubit 102-1 is tuned very close to the resonant frequency of the coupling resonator, the first qubit can, when in the excited state, relax back down to the ground state by emitting a photon (similar to how an excited atom would relax) that would resonate within the coupling resonator. If the second qubit 102-2 is also at this energy (i.e. if the frequency of the second qubit is also tuned very close to the resonant frequency of the coupling resonator), then it can absorb the photon emitted from the first qubit, via the coupling resonator coupling these two qubits, and be excited from its ground state to an excited state. Thus, the two qubits interact, or are entangled, in that a state of one qubit is controlled by the state of another qubit. In other scenarios, two qubits could interact via exchange of virtual photons, where the qubits do not have to be tuned to be at the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator or on the neighboring qubit via a virtual photon transfer through the bus. If there is nowhere for such a frequency-detuned photon to go, the qubit will be better isolated from its surroundings and will live longer in its current state. Thus, in general, two or more qubits could be configured to reduce interactions with one another by tuning their frequencies to specific values or ranges.

The state(s) of each qubit 102 may be read by way of its corresponding readout resonator of the resonators 110. As explained below, the state of qubit 102 induces a shift in the resonant frequency in the associated readout resonator. This shift in resonant frequency can then be read out using its coupling to a feedline. To that end, an individual readout resonator may be provided for each qubit. As described above, a readout resonator may be a transmission line segment that includes a capacitive connection to ground on one side and is either shorted to the ground on the other side (for a quarter-wavelength resonator) or has a capacitive connection to ground (for a half-wavelength resonator), which results in oscillations within the transmission line (resonance) that depends upon the state of a proximal qubit. A readout resonator may be coupled to its corresponding qubit 102 by being in an appropriate location and sufficient proximity to the qubit, more specifically in an appropriate location and sufficient proximity to a first element (e.g., "island," described below) of the qubit 102 that capacitively couples to the readout resonator, when the qubit is implemented as a transmon. Due to a coupling between the readout resonator and the qubit, changes in the state of the qubit result in changes of the resonant frequency of the readout resonator. In turn, by ensuring that the readout resonator is in sufficient proximity to a corresponding microwave feedline, changes in the resonant frequency of the readout resonator induce changes in the transmission coefficients of the microwave feedline which may be detected externally.

A coupling resonator, or, more generally, a coupling component, allows coupling different qubits together, e.g., as described above, in order to realize quantum logic gates. A coupling component could be comprised of a coupling component on a neighboring qubit, a lumped element capacitor, a lumped element resonator, or a transmission line segment. A coupling transmission line segment (e.g., coupling resonator or bus resonator) is similar to a readout resonator in that it is a transmission line segment that includes capacitive connections to various objects (e.g., qubits, ground, etc.) on both sides (i.e. a half-wavelength resonator), which also results in oscillations within the coupling resonator. Each side/end of a coupling component is coupled (again, either capacitively or inductively) to a respective qubit by being in appropriate location and sufficient proximity to the qubit, namely in sufficient proximity to a first element (or "island") of the qubit that capacitively couples to the coupling component, when the qubit is implemented as a transmon. Because each side of a given coupling component has coupling with a respective different qubit, the two qubits are coupled together through the coupling component. Thus, coupling components may be employed in order to implement multi-qubit interactions.

In some implementations, a microwave line (also sometimes referred to as a "microwave feedline") may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines may be used to only readout the state of the qubits as described above, while separate drive lines, may be used to control the state of the qubits. In such implementations, microwave lines used for readout may be referred to as "microwave readout lines," while microwave lines used for controlling the quantum state of the qubits may be referred to as "microwave drive lines." Microwave drive lines may control the state of their respective qubits 102 by providing to the qubits a microwave pulse at or close to the qubit frequency, which in turn stimulates (i.e. triggers) a transition between the states of the qubit. By varying the length of this pulse, a partial transition can be stimulated, giving a superposition of the states of the qubit.

Flux bias lines, microwave lines, readout lines, drive lines, coupling components, and readout resonators, e.g., those described above, together form interconnects for supporting propagation of microwave signals. Further, any other connections for providing direct electrical interconnection between different quantum circuit elements and components, e.g., connections from electrodes of Josephson Junctions to plates of the capacitors or to superconducting loops of SQUIDs or connections between two ground lines of a particular transmission line for equalizing electrostatic potential on the two ground lines, may also be referred to as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g., analog-to-digital converters, mixers, multiplexers, amplifiers, etc.

In various embodiments, various conductive circuit elements of supporting circuitry included in a quantum circuit such as the quantum circuit assembly 100 could have different shapes and layouts. In general, the term "line" as used herein in context of signal lines or transmission lines does not imply straight lines, unless specifically stated so. For example, some resonant or non-resonant transmission lines or parts thereof (e.g., conductor strips of resonant or non-resonant transmission lines) may comprise more curves, wiggles, and turns while other resonant or non-resonant transmission lines or parts thereof may comprise less curves, wiggles, and turns, and some transmission lines or parts thereof may comprise substantially straight lines. In some embodiments, at least some of the non-resonant transmission lines 108 or resonators 110 shown in FIG. 1 may be implemented as buried transmission lines according to any of the embodiments described herein. In some embodiments, at least some of the circuit elements 106 shown in FIG. 1, e.g., shunt capacitors connected in electrical parallel to Josephson Junctions, may be implemented as buried capacitors according to any of the embodiments described herein.

The qubits 102, the non-resonant transmission lines 108, and the resonators 110 of the quantum circuit assembly 100 may be provided on, over, or at least partially embedded in a substrate (not shown in FIG. 1). The substrate may be any substrate suitable for realizing quantum circuit assemblies described herein. In one implementation, the substrate may be a crystalline substrate such as, but not limited to a silicon or a sapphire substrate, and may be provided as a wafer or a portion thereof. In other implementations, the substrate may be non-crystalline. In general, any material that provides sufficient advantages (e.g., sufficiently good electrical isolation and/or ability to apply known fabrication and processing techniques) to outweigh the possible disadvantages (e.g., negative effects of spurious TLS's), and that may serve as a foundation upon which a quantum circuit may be built, falls within the spirit and scope of the present disclosure. Additional examples of substrates include silicon-on-insulator (SOI) substrates, III-V substrates, and quartz substrates.

In various embodiments, quantum circuits such as the one shown in FIG. 1 may be used to implement components associated with a quantum IC. Such components may include those that are mounted on or embedded in a quantum IC, or those connected to a quantum IC. The quantum IC may be either analog or digital and may be used in a number of applications within or associated with quantum systems, e.g., quantum processors, quantum amplifiers, quantum sensors, etc., depending on the components associated with the IC. The IC may be employed as part of a chipset for executing one or more related functions in a quantum system.

Figure 2A:
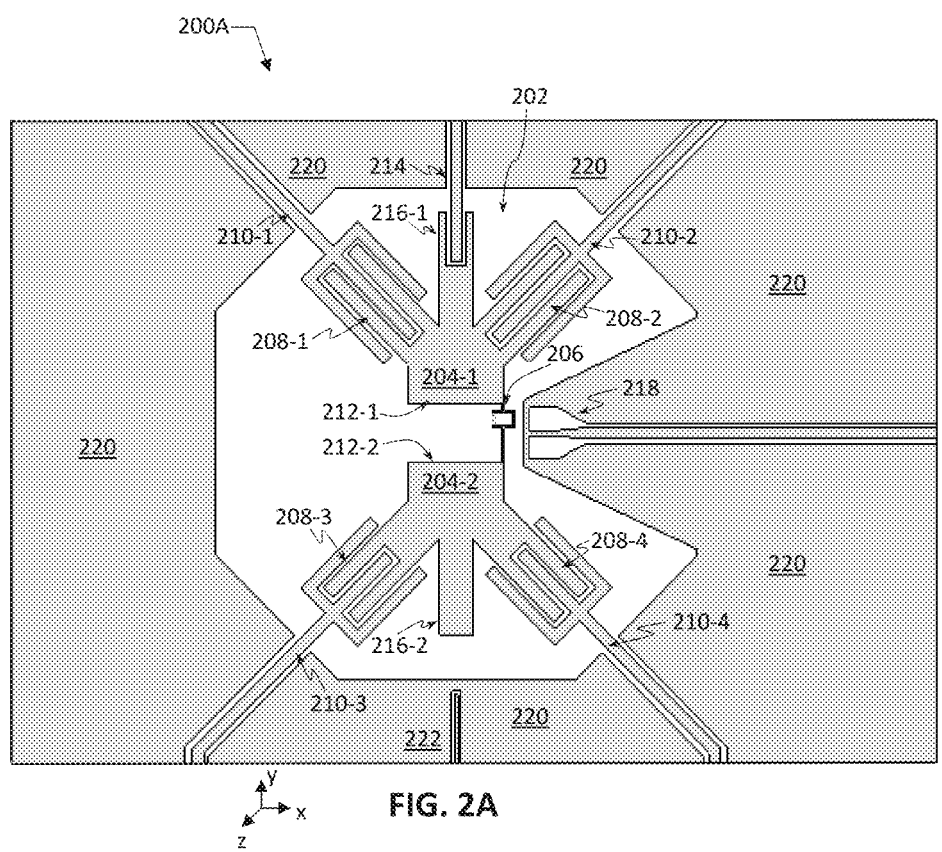
FIG. 2A illustrates an example layout design of a quantum circuit assembly with a superconducting qubit device capacitively coupled to 4-nearest neighbor quantum elements, according to one embodiment of the present disclosure.

FIG. 2A illustrates an example layout design of a quantum circuit assembly, e.g., the quantum circuit assembly 100, implementing a superconducting qubit device capacitively coupled to 4 nearest neighbor quantum elements, according to some embodiments of the present disclosure. While FIG. 2A illustrates an example layout design of a quantum circuit assembly where an individual superconducting qubit may have 4 nearest neighbors, descriptions provided herein are equally applicable to quantum circuit assemblies with qubits having any other number (any one or more) of nearest neighbors, where the term "nearest neighbors" refers to neighbors which may be at different distances from a given qubit, as long as they are more highly capacitively coupled to the given qubit than other qubits.

In FIG. 2A, the grey portions illustrate elements patterned from an electrically conductive, preferably superconductive, material (which may include any one or more materials e.g., superconductive materials listed above), while the white portions illustrate portions of an insulating material, e.g., portions of the substrate exposed by removal of the superconductive material. At the bottom of FIG. 2A an example coordinate system x-y-z is illustrated so that various dimensions described herein may be referred to a particular axis x, y, or z along which the dimensions are measured. The view of FIG. 2A is of the x-y plane of such a coordinate system.

FIG. 2A illustrates a quantum circuit assembly 200A showing a superconducting qubit device 202. The qubit device 202 may be viewed as including two islands made of a superconductive material, shown in FIG. 2A as a first island 204-1 and a second island 204-2. Each of the two islands 204 has a direct electrical connection to at least one non-linear inductive element e.g., a Josephson Junction, but in FIG. 2A each of the two islands is shown to have a direct electrical connection to a SQUID 206 (schematically shown in FIG. 2A as a loop, representing the superconducting loop of a SQUID). In this manner, the first and second islands 204-1 and 204-2 are connected to one another via one or more non-linear inductive elements e.g., Josephson Junctions, e.g., via the SQUID 206. In general, as used herein, "islands" refer electrically conductive elements of a given superconducting qubit that are connected to one another via one or more non-linear inductive elements, e.g., Josephson Junctions.

Various portions of the islands 204-1 and 204-2 are labeled in FIG. 2A with their own reference numerals in order to differentiate their functionality from other portions. For example, each of the islands 204-1 and 204-2 include portions 208 used to capacitively couple to an end portion of a respective coupling component, e.g., in this case a coupling resonator formed by a transmission line segment, 210. Thus, FIG. 2A illustrates a portion 208-1 of the first island 204-1 being capacitively coupled to a first coupling resonator 210-1, a portion 208-2 of the first island 204-1 being capacitively coupled to a second coupling resonator 210-2, a portion 208-3 of the second island 204-2 being capacitively coupled to a third coupling resonator 210-3, and a portion 208-4 of the second island 204-2 being capacitively coupled to a fourth coupling resonator 210-4. Each of the coupling resonators 210 may couple the qubit 202 to an individual other superconducting qubit (these further qubits not shown in the view of FIG. 2A), and may implement a coupling resonator of the resonators 110 described above.

The interdigitated geometry is schematically illustrated in the layout design shown in FIG. 2A where portions 208 of the qubit 202 are shown to form interdigitated capacitors with the ends of the corresponding coupling resonators 210 which are closest to such portions. While FIG. 2A illustrates each such interdigitated capacitor as having two fingers on the side of the respective portion 208 and having three fingers on the end side of the corresponding coupling resonator 210, in other embodiments, any other number of fingers of interdigitated capacitors may be used. Furthermore, descriptions provided with respect to FIG. 2A are equally applicable to embodiments where e.g., a shape of a portion of any coupling resonator 210 coupled to respective portion 208 of the qubit 202 is meandering (i.e. following a winding course, or comprising a plurality of convex and concave portions) and conformal to a shape of the portion 208, such two portions (i.e. a portion of any coupling resonator 210 and a respective portion 208) separated by a thin gap as to form a capacitor of an interlocking puzzle-piece shape, e.g., an interdigitated capacitor with one or more rounded corners, as well as to embodiments where portions 208 of the qubit 202 and the ends of the corresponding coupling resonators 210 which are closest to such portions form capacitors other than the interdigitated capacitors. Still further, in other embodiments (not specifically shown in FIG. 2A), the islands 204 with its corresponding portions 208 of the qubit 202 may be implemented as buried capacitors described herein, instead of the interdigitated capacitors shown in FIG. 2A.

Also shown in FIG. 2A are portions 212 of each of the islands 204-1 and 204-2, which portions may provide the greatest contribution to the capacitance between the islands 204-1 and 204-2 since portions 212 are opposite one another and are the closest to one another, compared to other portions of the islands 204. Thus, FIG. 2A illustrates a portion 212-1 of the first island 204-1 being opposite to a portion 212-2 of the second island 204-2. Portions 212-1 and 212-2 may be seen as forming a shunt capacitor (i.e. an example of the circuit elements 106 shown in FIG. 1), connected in electrical parallel to one or more non-linear inductive elements, e.g., Josephson Junctions in the SQUID 206, where, in some embodiments, the shunt capacitor may be implemented as a buried capacitor described herein. In the embodiment shown in FIG. 2A, the distance between two such portions 212-1 and 212-2 (i.e. a dimension measured along the y-axis in the coordinate system shown in FIG. 2A) is substantially the same across these opposite portions. For example, in various embodiments, the distance between portions 212-1 and 212-2 may be between about 20 nm and 200 micrometers (um), including all values and ranges therein, e.g., between about 40 and 500 um, or between about 50 nm and 1 um. However, in other embodiments (not specifically shown in FIGS.), this distance may vary. Furthermore, in the embodiment shown in FIG. 2A, portions 212-1 and 212-2 which are facing one another may be relatively small, as this may be beneficial for reducing the capacitance between the islands which may be helpful in terms of advantageously increasing coupling strength and decreasing the time it takes two qubits to interact (if the time it takes two qubits to interact is decreased, the likelihood that they can interact before one or both of them decohere increases). For example, in some embodiments, a length of at least one of the portions 212-1 or 212-2 (i.e. a dimension measured along the x-axis of the coordinate system shown in FIG. 2A) may be between about 1 and 500 um, including all values and ranges therein, e.g., between about 50 and 300 um, or between about 80 and 150 um. However, in some embodiments, the portions 212-1 and 212-2 may extend longer in the direction of the x-axis of the coordinate system shown in FIG. 2A. It should be noted that FIG. 2A provides just one example illustration of a transmon qubit design, and, in other embodiments, the layout and shape of a shunt capacitor may be different. However, discussions provided herein with respect to the portions 212-1 and 212-2 refer to the first and second plates/electrodes of any parallel-plate shunt capacitor design, all of which designs can be implemented as buried capacitors described herein.

FIG. 2A further illustrates a readout resonator 214, capacitively coupled to a portion 216-1 of the first island 204-1. The readout resonator 214 may be a readout resonator of the resonators 110 described above. For symmetry, as shown in FIG. 2A, in some embodiments the second island 204-2 may also have a similar portion 216-2, which may be coupled to a microwave drive line 222, for controlling the state of the qubit. In other embodiments, the coupling resonators 210, the readout resonators 214, and the microwave drive lines 222 may be arranged differently with respect to the qubit 202, e.g., based on routing requirements for a particular implementation. In various embodiments, the microwave drive line 222 may be a microwave drive line of the non-resonant transmission lines 108 described above.

FIG. 2A further illustrates a flux bias line 218 provided in the vicinity of the SQUID 206 in order to tune the frequency of the qubit 202, as described above with reference to FIG. 1. The flux bias line 218 may be a flux bias line of the non-resonant transmission lines 108 described above. Finally, FIG. 2A also illustrates ground planes 220, i.e. portions of electrically conductive, preferably superconductive, material connected to the ground or some other reference potential, surrounding the qubit 202.

Figure 2B:
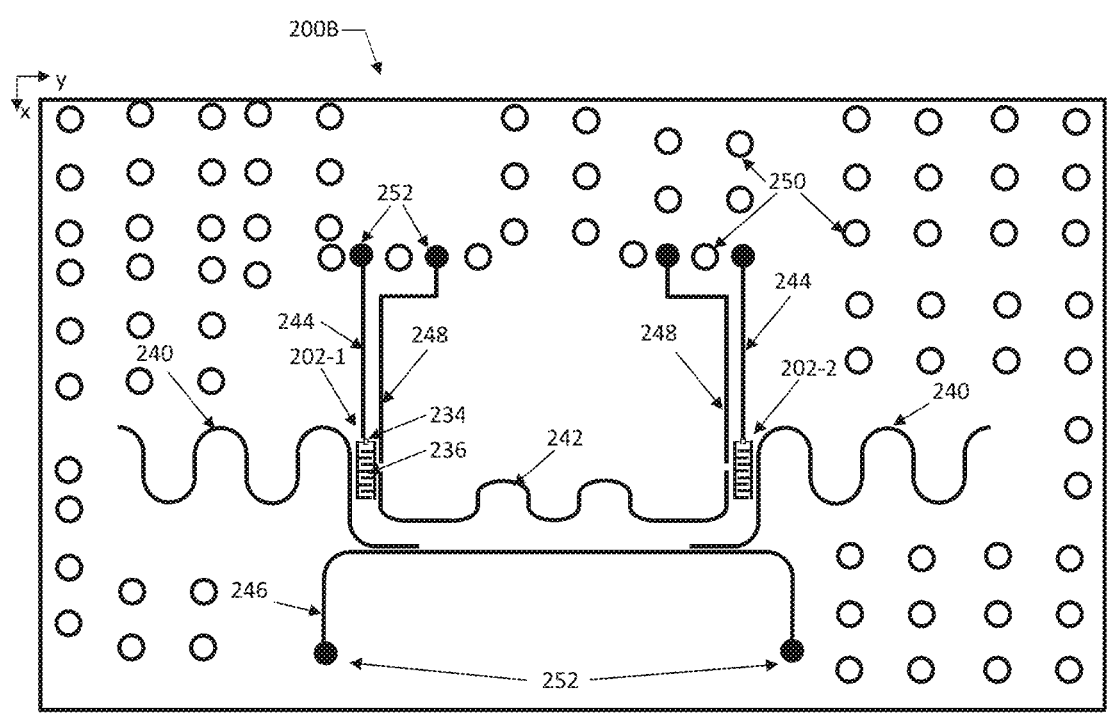
FIG. 2B provides a schematic illustration of an exemplary physical layout of a quantum circuit assembly that may include buried transmission lines and/or buried capacitors as described herein, according to some embodiments of the present disclosure.

FIG. 2B provides a schematic illustration of an exemplary physical layout of a quantum circuit assembly 200B, e.g. the quantum circuit assembly 100, implementing superconducting qubits 202 and including one or more of buried transmission lines and/or buried capacitors as described herein, according to some embodiments of the present disclosure. FIG. 2B may be seen as an alternative to the layout shown in FIG. 2BA, but showing two examples of qubit devices 202, shown in FIG. 2B as 202-1 and 202-2, each of which is an example of a superconducting qubit device 102 shown in FIG. 1. Thus, similar to FIG. 1, the quantum circuit assembly 200B may represent any of the superconducting qubit devices implemented on a qubit die to be packaged with a package substrate as described herein. In particular, the quantum circuit 200B may be seen as illustrating an exemplary layout of the quantum circuit assembly 100 shown in FIG. 1 where the qubits 102, shown in FIG. 2B as qubits 202, are implemented as transmons. The use of transmons is shown in FIG. 2B by illustrating that each of the two qubit 202 shown in FIG. 2B includes an interdigitated capacitor 236 (labeled for only one of the two qubits 202 shown in FIG. 2B in order to not clutter the drawing) and a SQUID loop 234 (a small square shown in FIG. 2B, also labeled for only one of the two qubits 202 shown in FIG. 2B). The capacitor 236 shown in FIG. 2B may be seen as an example of the circuit elements 106 shown in FIG. 1, while the Josephson Junctions of the SQUID loop 234 shown in FIG. 2B (Josephson Junctions not shown specifically in FIG. 2B) may be seen as an example of the Josephson Junctions 104 shown in FIG. 1. In other embodiments, the capacitors 236 may be any other type of capacitors, not necessarily interdigitated capacitors as shown in FIG. 2B. In particular, in some embodiments, one or more of the capacitors 236 may be implemented as the vertical buried parallel-plate capacitors described herein, e.g. any embodiments of the capacitor 910 shown in FIG. 9.

Similar to FIG. 1, FIG. 2B illustrates two qubits 202. In addition, FIG. 2B illustrates exemplary layout of readout resonators 240 (one readout resonator 240 per qubit 202), a coupling resonator 242 coupling the two qubits 202, flux bias lines 244 (one flux bias line 244 per qubit 202), a microwave feedline 246 (illustrated as a single microwave feedline 246, although in other embodiments individual microwave feedlines may be used for each of the qubits 202), and drive lines 248. The readout and coupling resonators 240, 242 may be seen as examples of the resonators 110 shown in FIG. 1. The flux bias lines 244, microwave feedline 246, and drive lines 248 may be seen as examples of non-resonant transmission lines 108 shown in FIG. 1. Functionality of each of these elements is described above, with reference to FIG. 1, and, therefore, in the interests of brevity, is not repeated here.

In various embodiments, various conductive circuit elements shown in FIG. 2B, e.g. resonators or various non-resonant transmission lines included in she quantum circuit 200B could have different shapes and layouts, and could be placed at different locations with respect to one another compared to what is shown in the example of FIG. 2B. As described above, in general, the term "line" as e.g. used herein in context of resonant or non-resonant transmission lines, or e.g. signal lines of such transmission lines, does not imply straight lines, unless specifically stated so. As shown in FIG. 2B, resonators 240 and 242 may include curves, wiggles, and turns (also applicable to non-resonant transmission lines of a superconducting quantum circuit assembly). In various embodiments, any of the readout resonators 240, coupling resonators 242, the flux bias lines 244, the microwave feedline 246, and the drive lines 248 may be implemented as vertical at least partially buried transmission lines described herein, e.g. any of the transmission lines 310 shown in FIGS. 3-8.

FIG. 2B further illustrates that the quantum circuit 200B may include various conductive contacts 250, 252 shown in FIG. 2B as white and black circles, respectively. The white circles (only 3 of which are labeled in FIG. 2B with the reference numeral 250 in order to not clutter the drawing) illustrate exemplary locations of ground conductive contacts 250 (i.e. contacts which are to be connected to the ground potential during operation of the device), e.g. conductive bumps, at a face of the qubit die, to be connected to the opposing face of a package substrate. As is known in the art, such ground contacts are typically used when a die supports propagation of microwave signals in order to e.g. suppress microwave parallel plate modes, cross-coupling between circuital blocks, and substrate resonant modes. In general, providing ground pathways may improve signal quality, enable fast pulse excitation, suppress radiation loss and undesired resonator modes, and improve the isolation between the different lines. The black circles (only 2 of which are labeled in FIG. 2B with the reference numeral 252 in order to not clutter the drawing) illustrate exemplary locations of signal conductive contacts 252 (i.e. contacts which are to be connected to the signal source during operation of the device), e.g. conductive bumps, at a face of the qubit die, to be connected to the opposing face of a package substrate. The signals conductive contacts 252 may be used for programming, tuning and readout of the qubits, e.g. as described above. The die on which these conductive contacts 250, 252 and the rest of the quantum circuit are provided may include multiple conductive layers that may be electrically isolated from each other by an insulating material, which could include any suitable material, such as an interlayer dielectric (ILD). Examples of insulating materials may include silicon oxide, silicon nitride, aluminum oxide, carbon-doped oxide, and/or silicon oxynitride.

In various embodiments, the signal conductor 306 of any of the transmission lines 310 described herein may be connected to the corresponding signal conductive contacts 252, while the ground conductors 304 of any of the transmission lines 310 described herein may be connected to the corresponding ground conductive contacts 250.

The illustration of the location and the number of the ground contacts 250 and the signal contacts 252 in FIG. 2B is purely illustrative and, in various embodiments, the contacts 250, 252 may be provided at different places, as known in microwave engineering. Furthermore, while FIGS. 1 and 2B illustrate examples of quantum circuits comprising only two qubits, embodiments with any larger number of qubits are possible and are within the scope of the present disclosure.

Engineering Vertical Buried Transmission Lines for Qubits

As described above, in general, a quantum circuit may be viewed as comprising a plurality of qubits and a plurality of transmission lines for providing microwave connectivity to, from, and between the qubits. The qubits may be implemented as any of the suitable qubits, e.g., superconducting qubits (e.g., transmons), quantum dot qubits, etc., and various transmission lines may be either resonant (e.g., the resonators 110 shown in FIG. 1) or non-resonant (e.g., the non-resonant transmission lines 108 shown in FIG. 1), as also described above.

In various embodiments, some or all of the non-resonant transmission lines and some or all of the resonators (if present) of quantum circuit assemblies as described above, as well as, optionally, some or all of other microwave interconnects in a quantum circuit, may be implemented in the form of vertical buried transmission line structures as described herein. In particular, FIGS. 3-8 illustrate various quantum circuit assemblies with example vertical buried transmission lines in accordance with various embodiments of the present disclosure.

In general, a microwave transmission line includes a signal conductor (i.e. a structure of an electrically conductive material connected, during operation, to a signal source), which may be implemented either as a signal line or a signal plane, and at least one ground conductor (i.e. a structure of an electrically conductive material connected, during operation, to a ground potential or any other reference potential) configured to provide electromagnetic shielding for the signal conductor. Often, microwave transmission lines are implemented with two ground conductors, provided on different sides of the signal conductor, in order to provide improved electromagnetic shielding.

As described above, conventionally, microwave transmission lines in quantum circuit assemblies have been implemented as CPWs, i.e. as a structure in which a signal line extends in the qubit plane (i.e. the x-y plane shown in FIG. 2A, or the plane of the substrate/qubit die), with two ground planes provided on either side of the signal line, each of the ground planes also extending in the qubit plane. Thus, in such conventional implementations, only the thickness of various portions of a microwave transmission line is measured in the direction of the z-axis (i.e. perpendicular to the qubit plane), while the width and the length of the line is measured in the x-y plane. If such a line is a straight line, or at least for portions of such a line which are straight portions, then it may be defined that the length is measured along a first line in the x-y plane, e.g., the x-axis, while the width is measured along a second line, which second line is perpendicular to the first line and also lies in the x-y plane, e.g., the y-axis.

In contrast to such conventional implementations, various transmission lines described herein are implemented in a vertical geometry, i.e. where a ground conductor (or both ground conductors in case two of them are implemented) is a plane or a layer that is provided substantially perpendicular to the qubit plane/substrate, and is at least partially buried in the substrate. Thus, for various transmission lines described herein, it is the width of the ground conductor that is measured along a line substantially perpendicular to the plane of the substrate (i.e. in the direction of the z-axis of an example coordinate system described herein), with the length and the thickness of the ground conductor being measured in the x-y plane of the example coordinate system described herein, where the terms "width," "length," and "thickness" of a ground conductor are used in a conventional manner used in microwave engineering in order to calculate various characteristics of a microwave transmission line.

In FIGS. 3-8, same reference numerals are used to indicate analogous elements. In particular, each of FIGS. 3-8 illustrates a substrate 302, one or more ground conductors 304 (in the embodiments where two ground conductors are used, individual ground conductors 304 are shown as ground conductors 304-1 and 304-2), a signal conductor 306, and a gap 308 between the signal conductor 306 and each of the one or more ground conductors 304 (in the embodiments where two ground conductors are used, gaps 308 from the signal conductor 306 to the individual ground conductors 304 are shown as gaps 308-1 and 308-2). Together, the one or more ground conductors 304 and the signal conductor 306, separated from each of the one or more ground conductors 304 by a respective gap 308, form at least a portion of a transmission line 310 of a quantum circuit assembly, which could be a non-resonant transmission line (e.g., any of the non-resonant transmission lines 108 described above) or a resonant transmission line (e.g., any of the resonators 110 described above). For example, in various embodiments, the microwave transmission lines 310 shown in FIGS. 3-8 may be used to realize one or more of coupling resonators, readout resonators, microwave drive lines, microwave feedlines, or flux bias lines, as described above. Example physical layouts of quantum circuit assemblies with such coupling resonators, readout resonators, microwave drive lines, microwave feedlines, and flux bias lines are illustrated in FIGS. 2A and 2B.

An example coordinate system is also shown for each of FIGS. 3-8. It should be noted that each of FIGS. 3-8 illustrates a straight portion of the microwave transmission line 310, although, as described above and as e.g. illustrated in FIG. 2B described below, various transmission lines used in quantum circuit assemblies may include curves, wiggles, and turns. Thus, in general, although not specifically shown in FIGS. 3-8, some resonant or non-resonant transmission lines 310 may comprise more curves, wiggles, and turns while other resonant or non-resonant transmission lines 310 may comprise less curves, wiggles, and turns, and some transmission lines or parts thereof may comprise substantially straight lines. For all of such transmission lines 310, the meaning of the terms "width," "length," and "thickness" for various layer-conductors used therein (e.g., at least the one or more ground conductors 304 and also, optionally, the signal conductor 306 in case it is implemented as a layer-conductor) remains the same. Namely, the width of a layer-conductor of any of the microwave transmission lines 310 refers to the dimension measured substantially perpendicularly to the plane of the substrate 302 (the width of the ground conductors 304 indicated in FIGS. 3-8 as "W"), while the length and the thickness of a layer-conductor of any of the microwave transmission lines 310 refers to the respective dimensions measured in any suitable plane substantially parallel to the plane of the substrate 302 (the length of the ground conductors 304 indicated in FIGS. 3-8 as "L" and the thickness of the ground conductors 304 indicated in FIGS. 3-8 as "T"). Again, because microwave transmission lines 310 may, in general, include portions which are not straight portions shown in FIGS. 3-8, while FIGS. 3-8 indicate the length L to be measured along the x-axis of the example coordinate system shown and indicate the thickness T to be measured along the y-axis of the example coordinate system shown, in general, the length L and the thickness T can be measured along other lines (perpendicular to one another) in the x-y plane, where the direction of the lines would change depending on how the transmission line 310 curves.

In various embodiments of the present disclosure, the width W of the ground conductor 304 of any of the microwave transmission lines 310 shown in FIGS. 3-8 is smaller than the length L of the ground conductor 304, e.g., at least about 5 times smaller, preferably at least about 10 times smaller. Furthermore, in various embodiments of the present disclosure, the thickness T of the ground conductor 304 of any of the microwave transmission lines 310 shown in FIGS. 3-8 is smaller than the width W of the ground conductor 304, e.g., at least about 2 times smaller, preferably at least about 5 times smaller. Still further, in general, a ratio of the length L to the thickness T may be greater than the ratio of the width W to the thickness T, e.g., at least about 5 times greater, preferably at least about 10 times greater (e.g., the width W could be about 1 um and the thickness T could be about 150 nm). In some embodiments, the width W of the ground conductor 304 may be between about 50 nanometers (nm) and 1000 micrometers (um), including all values and ranges therein, e.g., between about 300 nm and 500 um, or between 500 nm and 200 um. In some embodiments, the length L of the ground conductor 304 may be greater than about 250 nm, including all values and ranges therein, e.g., greater than about 500 nm. In some embodiments, the thickness of the ground conductor 304 may be between about 25 nm and 500 um, including all values and ranges therein, e.g., between about 150 nm and 250 um, or between 250 nm and 100 um.

At least the ground conductor 304 may be seen as a substantially layer-conductor (although the plane may curve, wiggle, or turn) in that it may be a liner of an electrically conductive, preferably superconductive, material on inner sidewalls of an opening in the substrate 302 or in an interconnect support layer forming the upper (e.g., upper-most) portion of the substrate 302, which interconnect support layer may be a dielectric material, preferably low-loss dielectric material, e.g., a highly crystalline dielectric material e.g., epitaxially deposited silicon. In the embodiments where two ground conductors 304 are used, these conductors may be substantially parallel to one another. In cases where such ground conductors 304 have curves, wiggles, or turns, they may still be seen as "parallel" to one another in that a shape of one of the ground conductors 304 may conform to the shape of the other ground conductors 304 so that when one ground conductor 304 curves, wiggles, or turns, the other ground conductor 304 follows. Each of the ground conductors 304 may be separated from the signal conductor 306 by a respective gap 308, which gap may be between about 20 nm and 400 um, including all values and ranges therein, e.g., between about 200 nm and 200 um, or between about 2 and 100 um. In some embodiments, the gap 308 may be filled with air or any other gas or a combination of gasses. In other embodiments, the gap 308 may be substantially vacuum (as much as it is possible in real life to achieve vacuum).

Another feature common to each of FIGS. 3-8 is that at least a portion of the ground conductor(s) 304 may at least partially extend into the substrate 302 (or into a portion of the interconnect support layer described above, i.e. may be at least partially buried in the substrate. In various embodiments, such a portion may extend into the substrate by a depth between about 300 nm and 10 um, including all values and ranges therein, e.g., between about 500 nm and 5 um, or between about 1 and 2 um. Thus, at least a portion of the width W of the ground conductor(s) 304 may be within an opening in the substrate 302. Similarly, at least a portion of the signal conductor 306 may at least partially extend into the substrate 302, where the portion of the signal conductor 306 extending into the substrate 302 may be defined e.g., by the architecture of the corresponding one or more ground conductors 304 (e.g., so that the ground conductor(s) 304 are still able to provide adequate electromagnetic protection to the signal conductor 306). In some embodiments, dimensions (i.e. width, thickness, and length) of the signal conductor 306 may be substantially the same as those of the ground conductor(s) 304, described above. In other embodiments, at least some dimensions of the signal conductor 306 may be different from those of the ground conductor(s) 304. Furthermore, in various embodiments, the signal conductor 306 may be aligned in different manners with respect to the one or more ground conductors 304, as described in greater details below.

Figure 3:
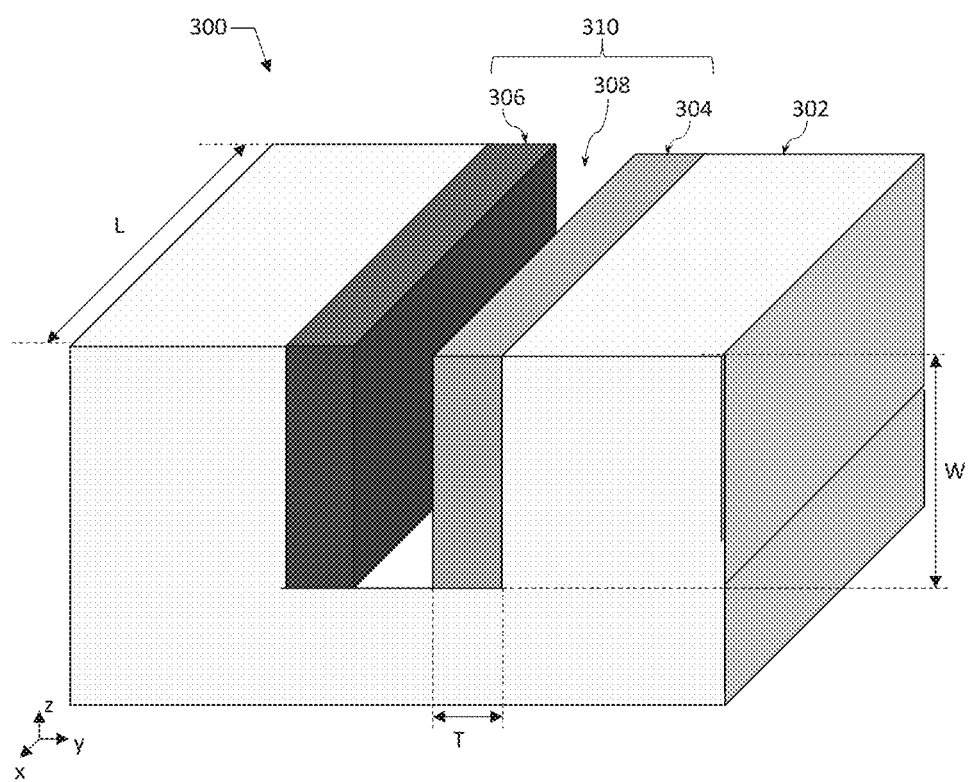
FIGS. 3-8 illustrate various quantum circuit assemblies with buried transmission lines in accordance with various embodiments of the present disclosure.

Turning to the individual ones of FIGS. 3-8, FIG. 3 illustrates an embodiment of a quantum circuit assembly 300 in which the microwave transmission line 310 includes only a single ground conductor 304 and in which the signal conductor 306, e.g., each being formed of a superconductive material (same for FIGS. 4-8), is implemented as a layer-conductor that is substantially aligned with the ground conductor 304 and has a shape that is substantially the same as that of the ground conductor 304. In such an embodiment, the ground conductor 304 and the signal conductor 306 may be provided as liners of respective electrically conductive materials (which may either be the same or different materials) on sidewalls of an opening formed in the substrate 302 (the opening being sufficient to house the transmission line 310). In other embodiments of the quantum circuit assembly 300, the signal conductor 306 may be implemented substantially as a conductor line and not a plane as shown in FIG. 3, where the conductor line of the signal conductor 306 may be centered e.g., at the center of the width of the ground conductor 304.

Figure 4:
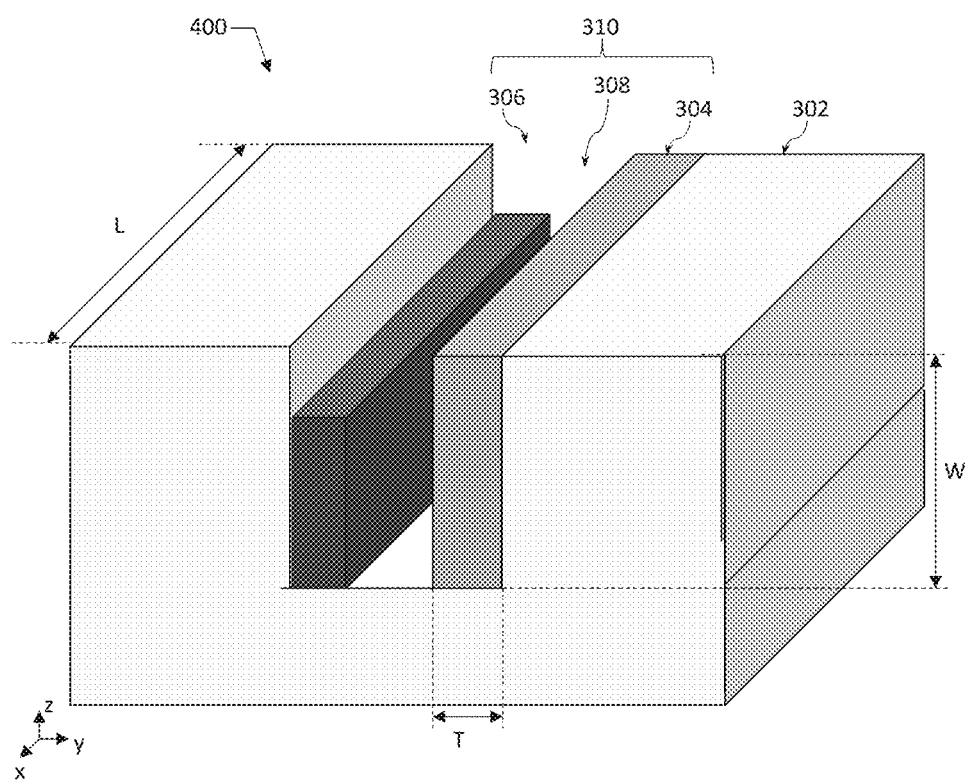

FIG. 4 illustrates an embodiment of a quantum circuit assembly 400 in which the microwave transmission line 310 includes only a single ground conductor 304 and the signal conductor 306 is implemented as a layer-conductor that is substantially aligned with the ground conductor 304 only at the bottom and has a width that is less than that of the ground conductor 304. In other embodiments of the quantum circuit assembly 400, the signal conductor 306 may be implemented substantially as a conductor line and not a plane as shown in FIG. 4, where the conductor line of the signal conductor 306 may be aligned with the bottom of the ground conductor 304.

Figure 5:
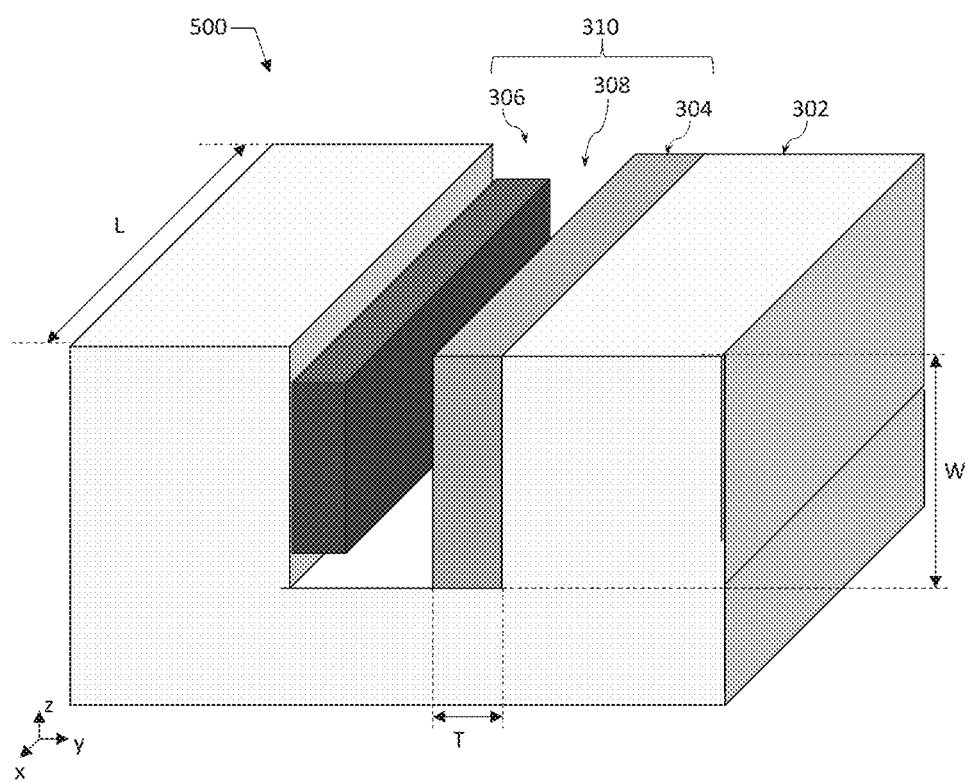

FIG. 5 illustrates an embodiment of a quantum circuit assembly 500 in which the microwave transmission line 310 includes only a single ground conductor 304 and the signal conductor 306 has a width that is less than that of the ground conductor 304, as in FIG. 4, but, in contrast to FIG. 4, is aligned to be substantially in the center with respect to the width of the ground conductor 304.

Figure 6:
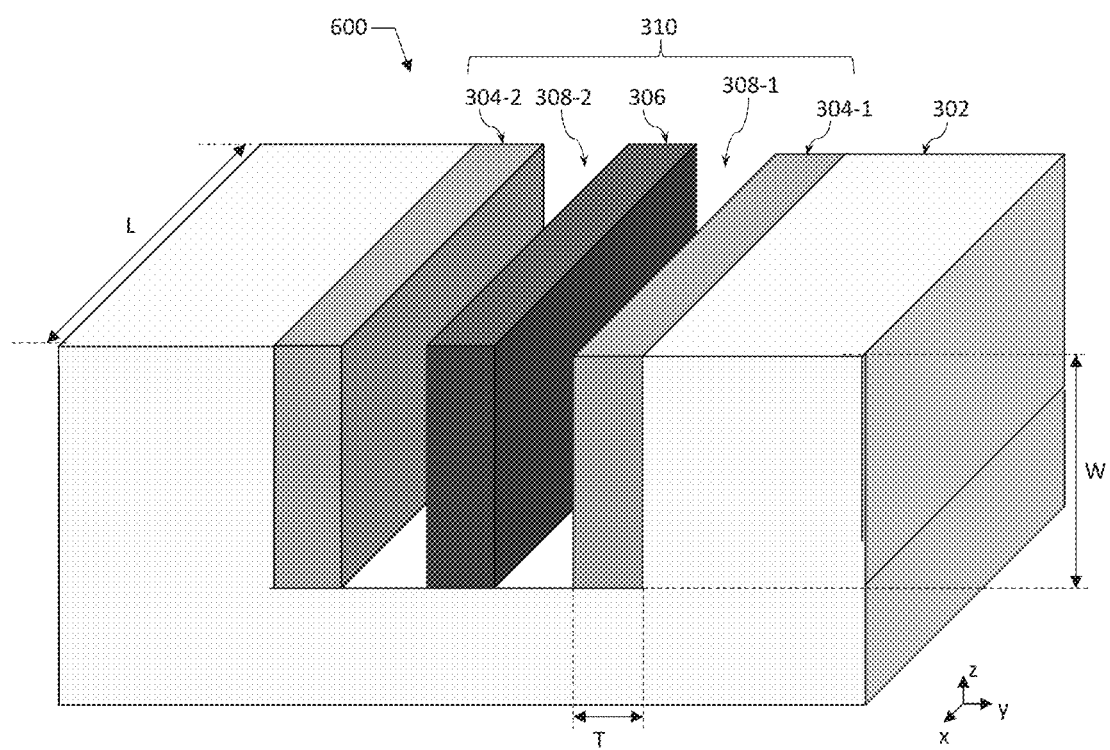

FIG. 6 illustrates an embodiment of a quantum circuit assembly 600 in which the microwave transmission line 310 is similar to that shown in FIG. 3, except that it includes two ground conductors 304, one on each side of the signal conductor 306, and separated from the signal conductor 306 by a respective gap 308. As shown in FIG. 6, in such an embodiment, the signal conductor 306 may be implemented as a layer-conductor that is substantially aligned with the ground conductors 304 and has a shape that is substantially the same as that of the ground conductors 304. In such an embodiment, the ground conductors 304 may be provided as liners of respective electrically conductive materials (which may either be the same or different materials) on sidewalls of an opening formed in the substrate 302 (the opening being sufficient to house the transmission line 310), while the signal conductor 306 may be provided in the remaining opening between the two ground conductors 304. In other embodiments of the quantum circuit assembly 600, the signal conductor 306 may be implemented substantially as a conductor line and not a plane as shown in FIG. 6, where the conductor line of the signal conductor 306 may be centered e.g., at the center of the width of the ground conductors 304.

Figure 7:
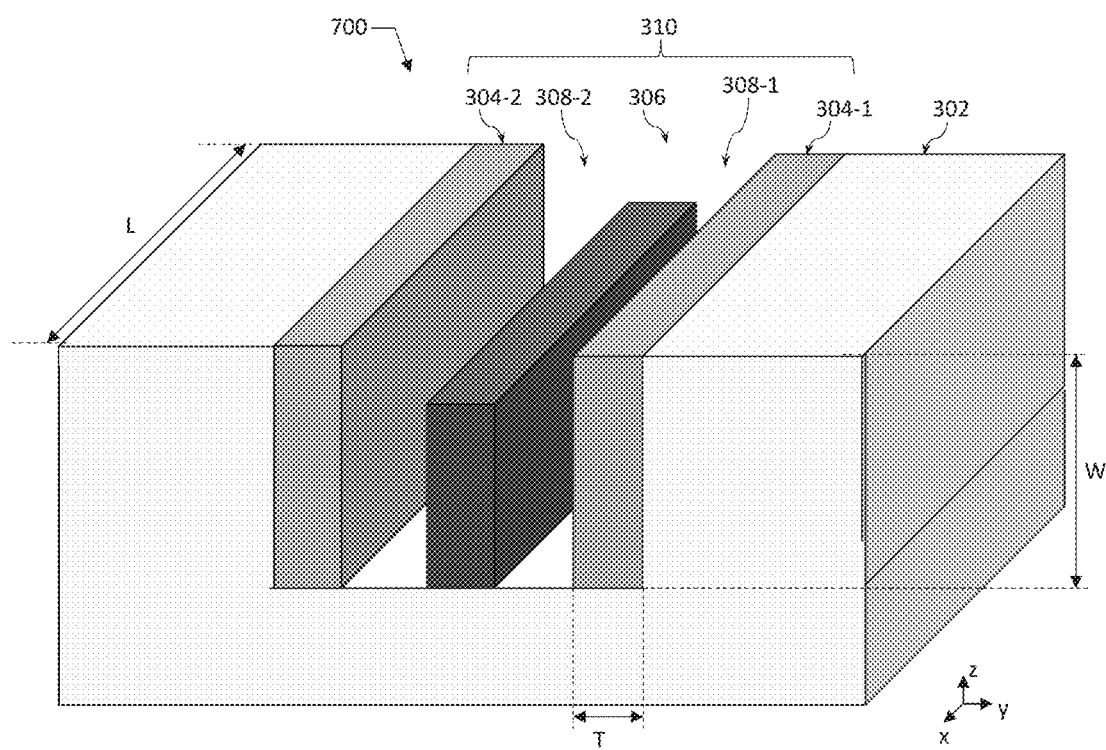

FIG. 7 illustrates an embodiment of a quantum circuit assembly 700 in which the microwave transmission line 310 is similar to that shown in FIG. 4, except that it includes two ground conductors 304, one on each side of the signal conductor 306, and separated from the signal conductor 306 by a respective gap 308. As shown in FIG. 7, in such an embodiment, the signal conductor 306 may be implemented as a layer-conductor that is substantially aligned with the ground conductors 304 only at the bottom and has a width that is less than that of the ground conductors 304. In other embodiments of the quantum circuit assembly 700, the signal conductor 306 may be implemented substantially as a conductor line and not a plane as shown in FIG. 7, where the conductor line of the signal conductor 306 may be aligned with the bottom of the ground conductor 304.

Figure 8:
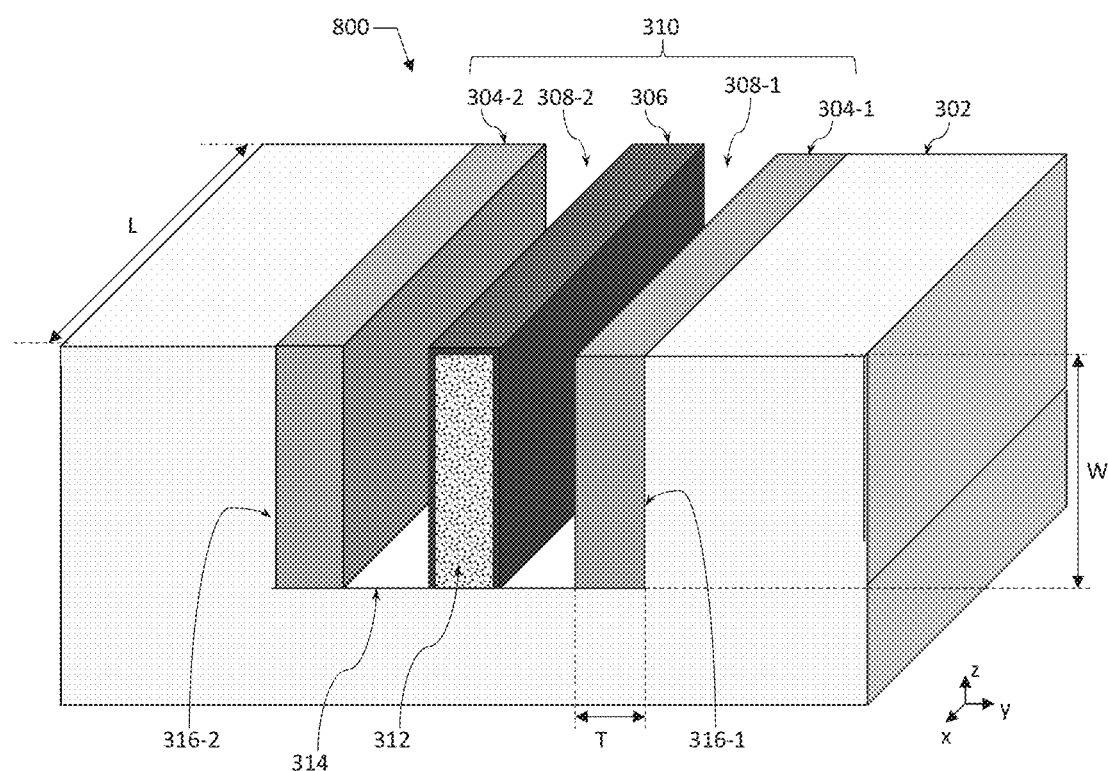

FIG. 8 illustrates an embodiment of a quantum circuit assembly 800 in which the microwave transmission line 310 is similar to that shown in FIG. 6, except that the signal conductor 306 as a layer wrapping around a fin 312 that extends from the bottom 314 of an opening in which the microwave transmission line 310 is provided. The fin 312 may be made of various materials. In some embodiments, the fin 312 may be made of the material of the substrate 302, e.g. in case the fin 312 is etched out of the substrate 302. In other embodiments, the fin 312 may include any other suitable material, e.g. any suitable dielectric material, including, but not limited to, one or more of silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. While FIG. 8 illustrates the signal conductor 306 being provided on both sidewalls of the fin 312, as well as on top of the fin 312 (i.e. the surface of the fin 312 furthest away from the bottom 314 of the opening), in general, the signal conductor 306 may be provided at least on a portion of one sidewall of the fin 312, all of which embodiments are within the scope of the present disclosure. In various embodiment, a thickness of the layer of the signal conductor 306 provided on the fin 312 may be between about 5 nanometers and 50 micrometers, including all values and ranges therein, e.g., between about 50 nanometers and 10 micrometers, or between about 100 nanometers and 1 micrometer.

As shown in FIG. 8, in an embodiment where the fin 312 is used, the fin 312 may be substantially aligned with the ground conductors 304 and may have a shape that is substantially the same as that of the ground conductors 304, so that, when a layer of the signal conductor 306 is provided over the fin 312, the signal conductor 306 is also substantially aligned with the ground conductors 304. Similar to FIG. 6, in such an embodiment, the ground conductors 304 may be provided as liners of respective electrically conductive materials (which may either be the same or different materials) on sidewalls of an opening formed in the substrate 302 (the opening being sufficient to house the transmission line 310), while the signal conductor 306 is provided as a liner around at least a portion of the fin 312. Thus, in the quantum circuit assembly 800, a first layer that includes one or more superconductive materials is provided on a first sidewall 316-1 of the opening and forms the first ground conductor 304-1; a second layer that includes one or more superconductive materials is provided on a second sidewall 316-2 of the opening and forms the second ground conductor 304-2; and a third layer that includes one or more superconductive materials is provided on at least one sidewall of the fin 312 to form the signal conductor 306. In various embodiments, a distance between the first layer that forms the first ground conductor 304-1 and a portion of the third layer provided over a sidewall of the fin closest to the first layer (i.e. the signal conductor 306 on the side of the fin 312 closest to the first ground conductor 304-1) may be between about 20 nanometers and 400 micrometers, including all values and ranges therein, e.g. between about 200 nanometers and 200 micrometers, or between about 2 and 100 micrometers. Similarly, a distance between the second layer that forms the second ground conductor 304-2 and a portion of the third layer provided over a sidewall of the fin closest to the second layer (i.e. the signal conductor 306 on the side of the fin 312 closest to the second ground conductor 304-2) may also be between about 20 nanometers and 400 micrometers, including all values and ranges therein, e.g. between about 200 nanometers and 200 micrometers, or between about 2 and 100 micrometers.

In some embodiments, a width of the fin 312 may be between about 10 nanometers and 100 micrometers, including all values and ranges therein, e.g. between about 40 nanometers and 40 micrometers. FIG. 8 illustrates that the height of the fin 312 is substantially equal to the depth of the opening in which the transmission line 310 is provided. However, in general, the height of the fin 312 may be smaller. In general, in various embodiments, a ratio of a height of the fin 312 to a depth of the opening in which the transmission line 310 is provided may be between about 0.6 and 1, including all values and ranges therein, e.g. between about 0.7 and 0.95, or between about 0.8 and 1.

Engineering Vertical Buried Capacitors for Qubits

Figure 9:
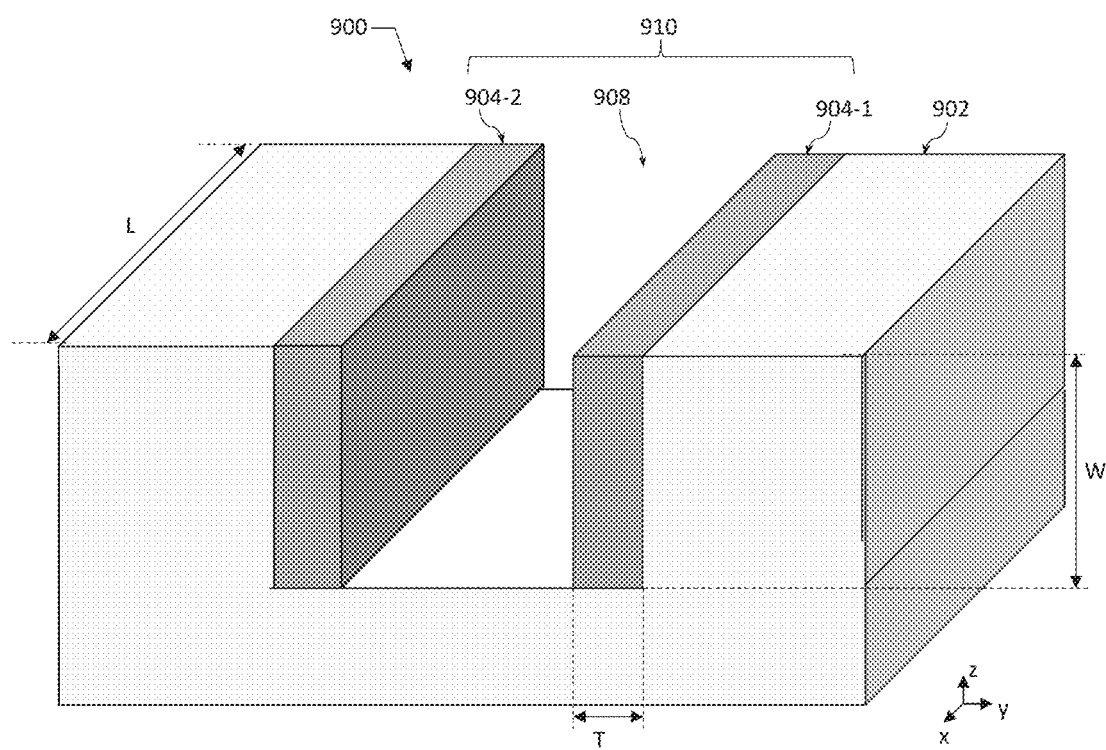
FIG. 9 illustrates a quantum circuit assembly with a buried capacitor, according to one embodiment of the present disclosure.

As described above, in general, a quantum circuit may also include one or more capacitors, e.g., capacitors used to realize capacitive coupling to between different qubits or shunt capacitors used within individual qubits, where the qubits may be implemented as any of the suitable qubits, e.g., superconducting qubits (e.g., transmons), quantum dot qubits, etc. In various embodiments, some or all of the capacitors in a quantum circuit may be implemented in the form of vertical buried capacitor structures as described herein. In particular, FIG. 9 illustrates an example quantum circuit assembly 900 with a buried capacitor in accordance with some embodiments of the present disclosure. In general, buried capacitors described herein may be implemented by providing two capacitor electrodes (or "capacitor plates") 904, shown in FIG. 9 as a first capacitor electrode 904-1 and a second capacitor electrode 904-2, provided opposite of one another and separated by a gap 908. At least portions of the capacitor electrodes 904 may be buried in a substrate 902.

The capacitor 910 may be implemented as a vertical buried capacitor and may be analogous to the microwave transmission lines 310, described above, that use two ground conductors 304, in that the capacitor electrodes 904 may be similar to the ground conductors 304 described above. Of course, the capacitor 910 would not include the signal conductor 306 as described above, in between the capacitor electrodes 904. In view of this, descriptions provided above for transmission lines 310 with two ground conductors 304, are applicable to the capacitor 910 and, in the interests of brevity, are not repeated. The substrate 902 may be implemented as the substrate 302, described above.

In some embodiments, the second capacitor electrode may be parallel to the first capacitor electrode (thus, the capacitor may be a "parallel-plate capacitor" because capacitor electrodes lie in parallel planes separated by a gap). In other embodiments, the capacitor electrodes 904 do not necessarily have to be "plates" but could have meandering shapes, i.e. shaped with curves, wiggles, or turns, similar to the ground conductors 304 described above, as long as the shapes of the capacitor electrodes 904 are conformal to one another, also as described above for the ground conductors 304.

In some embodiments, the gap 908 between the capacitor electrodes 904 may be similar to the gap 308, described above. In other embodiments, the gap 908 may be filled with a dielectric medium that is not gas or vacuum, e.g., with a dielectric solid or liquid. In various embodiments, the gap 908 (i.e. the distance between the first capacitor electrode 904-1 and the second capacitor electrode 904-2) may be between about 20 nm and 1 um, including all values and ranges therein, e.g., between about 40 and 500 nm, or between about 50 and 100 nm. In some implementations, providing the capacitor 910 as a parallel-plate capacitor with capacitor electrodes 904 being substantially perpendicular to the substrate 902 may allow decreasing the size of the gap between the capacitor electrodes, compared to conventional designs, which could advantageously increase the capacitance, e.g., a capacitance may be around 70 femtofarad (fF).

Manufacturing Vertical Buried Transmission Lines and Capacitors

Vertical buried transmission lines and capacitors as described herein, e.g., the vertical buried transmission lines 310 or vertical capacitors 910 described above, may be fabricated using various suitable techniques, all of which being within the scope of the present disclosure. One such example technique is shown in FIG. 10 and described below.

Figure 10:
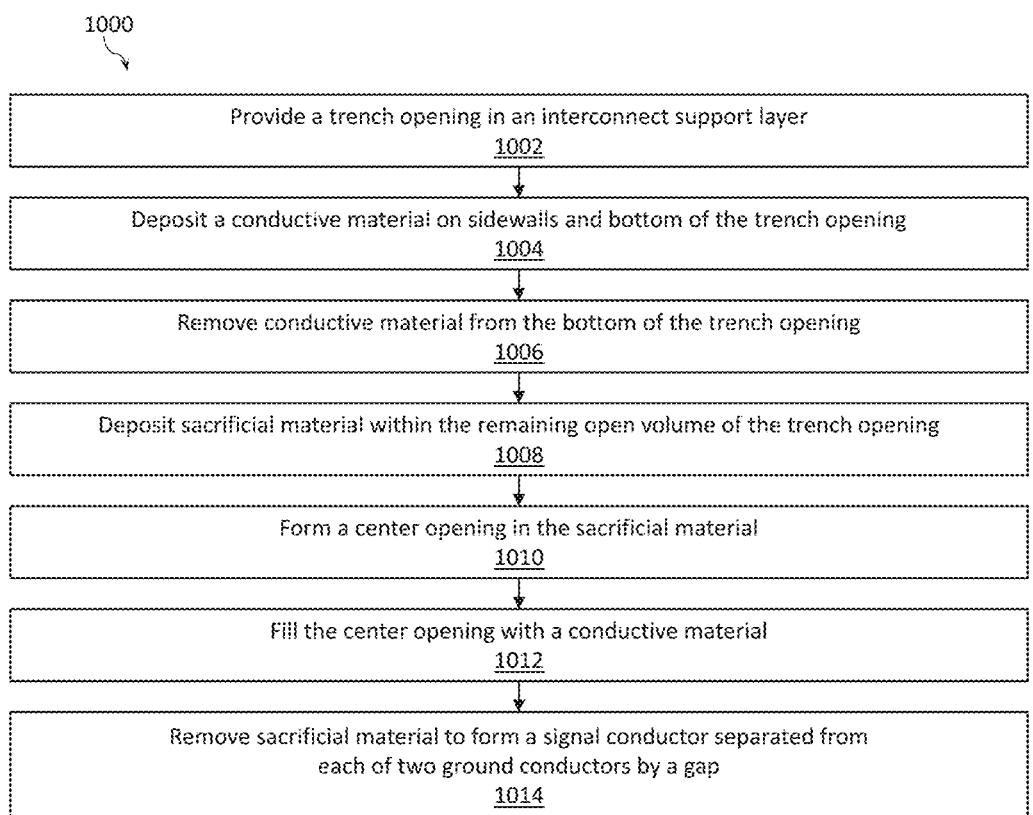
FIG. 10 is a flow diagram of an illustrative method of manufacturing a buried transmission line, according to one embodiment of the present disclosure.

FIG. 10 is a flow diagram of an illustrative method 1000 of manufacturing a vertical buried transmission line, in accordance with various embodiments of the present disclosure. In particular, FIG. 10 is an example of manufacturing a vertical buried transmission line that uses two ground conductors, e.g., the transmission lines as shown in FIG. 6 or 7, because this is the most involved manufacturing process, compared to that used to manufacture vertical buried transmission lines with only one ground conductor or compared to that used to manufacture vertical buried capacitors. The latter processes may be implemented in a manner similar to that shown in FIG. 10 with modifications that would be apparent to a person of ordinary skill in the art based on the descriptions provided herein.

Various operations of the method 1000 may be illustrated with reference to some example embodiments discussed below, but at least portions of the method 1000 may be used to manufacture any suitable vertical buried transmission lines according to any embodiments of the present disclosure. In addition, although the operations of the method 1000 are illustrated in FIG. 10 once each and in a particular order, the operations may be performed in any suitable order and repeated as desired. For example, one or more operations may be performed in parallel to manufacture multiple vertical buried transmission lines as described herein substantially simultaneously. In another example, the operations may be performed in a different order to reflect the architecture of a particular quantum circuit component that may include one or more vertical buried transmission lines according to any of the embodiments of the present disclosure.

Furthermore, the manufacturing method 1000 may include other operations, not specifically shown in FIG. 10, e.g., various cleaning and/or planarization operations as known in the art. For example, in some embodiments, the substrate 302 may be cleaned prior to or/and after any of the processes of providing the vertical buried transmission line as described herein, e.g., to remove oxide, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, in some embodiments, the quantum circuit assemblies as described herein may be planarized prior to or/and after any of the processes of providing the vertical buried transmission line as described herein, e.g., to remove the overburden of the materials deposited on the surfaces and to expose certain underlying elements. In some embodiments, planarization may be carried out using a polishing process e.g., chemical mechanical planarization (CMP), using a suitable slurry formulation and mechanical polishing process to remove unwanted materials from a wafer/structure, achieving a relatively smooth upper surface upon which further components of the quantum circuit assembly may be built.

Turning to FIG. 10, the method 1000 may begin with a process 1002 that includes providing an opening in a layer that may be referred to as an "interconnect support layer" because such a layer forms basis for fabricating vertical buried transmission lines described therein. The opening may be provided as a trench opening in a location within the interconnect support layer where a vertical buried transmission line according to various embodiments of the present disclosure is to be implemented, the trench opening having a geometry in the x-y plane as prescribed by design, where the trench opening may include various curves, wiggles, and turns.

In various embodiments, the trench opening may be created in the process 1002 using any suitable technique for removing desired portions of various materials, e.g., dry etch (e.g., reactive ion etch (RIE)) or wet etch, possibly in combination with any suitable patterning technique, e.g., photolithographic or electron-beam patterning, and/or in combination with using a mask. Dimensions of the opening provided in the process 1002 would be such as to include a vertical buried transmission line therein, with some example dimensions of vertical buried transmission lines described above.

The method 1000 may proceed with a process 1004 that includes depositing a conductive material on sidewalls and bottom of the trench opening provided in the process 1002. The conductive material deposited in the process 1004 may be an electrically conductive/superconductive material as one used in the ground structures 304 described above. In fact, at a final vertical buried transmission line, the conductive material provided on the inner sidewalls of the trench opening in the process 1004 will form a ground structure with two ground conductors 304, namely a ground structure with the two parallel ground planes. A liner of the conductive material may be deposited on sidewalls and bottom of the trench opening in the process 1004 using any suitable techniques for conformally depositing conductive materials onto selected surfaces, e.g., atomic layer deposition (ALD), chemical vapor deposition (CVD), plasma enhanced CVD (PECVD), or/and physical vapor deposition (PVD) processes e.g., sputter. As a result of depositing the conductive material as a liner within the trench opening in 1004, the volume of the trench opening is reduced but there still remains a smaller opening.

In a process 1006 of the method 1000, the conductive material deposited at the bottom of the trench opening in the process 1004 may be removed. In some embodiments, removal of the conductive material from the bottom of the trench opening in 1006 may be achieved using any suitable anisotropic etching processes (i.e. processes that etches in one directions, e.g., vertically, substantially more than in other directions), possibly in combination with using a mask or patterning. For example, the conductive material may be removed from the bottom of the trench opening using chlorine-based chemistry for dry etch if TiN is used as the conductive material, or using other known techniques suitable for a given type of material used as the conductive material.

The method 1000 may proceed with a process 1008 that includes filling the remaining empty volume of the remaining smaller trench opening with a material which may be referred to as "sacrificial" because some or all of it will be removed in a later process.

The sacrificial material used in 1008 may include any material that has sufficient etch selectivity with respect to at least the conductive material deposited in 1004, as well as preferably etch selective with respect to the material of the substrate 302, in order for an etch process used in a later stage to remove some or all of the sacrificial material deposited in 1008 to not etch substantially into the conductive material deposited in 1004 or the material of the substrate 302. As known in the art, two materials are said to have "sufficient etch selectivity" when etchants used to etch one material do not substantially etch the other, enabling selective etching of one material but not the other. Besides appropriate etching characteristics, some other considerations in selecting a suitable material for the sacrificial material used in 1008 may include e.g., possibilities of smooth film formation, low shrinkage and outgassing, and good dielectric properties (e.g., low electrical leakage, suitable value of a dielectric constant, and thermal stability).

In some embodiments, the sacrificial material used in 1008 may be a sacrificial dielectric material, e.g., any of the low-k or high-k dielectric materials used in semiconductor processing, including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used as the sacrificial material in 1008 may include, but are not limited to silicon nitride, silicon oxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Examples of low-k materials that may be used as the sacrificial material in 1008 may include, but are not limited to, fluorine-doped silicon dioxide, carbon-doped silicon dioxide, spin-on organic polymeric dielectrics e.g., polyimide, polynorbornenes, benzocyclobutene, and polytetrafluoroethylene (PTFE), or spin-on silicon-based polymeric dielectric e.g., hydrogen silsesquioxane (HSQ) and methylsilsesquioxane (MSQ)).

Any suitable deposition techniques may be used to fill the remaining opening with the sacrificial material in the process 1008. For example, techniques e.g., spin-coating, dip-coating, ALD, CVD, or PECVD may be used. A planarization can then be performed to remove overburden of the sacrificial material deposited in 1008 and ensure that the sacrificial material is confined to being within the trench opening.

In a process 1010 of the method 1000, another opening may be formed within the sacrificial material deposited, in 1008, in the opening lined with the conductive material. Such an opening may be formed substantially in the center of the opening into which the sacrificial material was deposited in 1008, and may be referred to in the following as a "signal conductor opening" because it will serve to provide a signal conductor 306. In various embodiments, removal of the sacrificial material to form the signal conductor opening may be achieved using any suitable technique for removing desired portions of dielectric materials, e.g., dry etch (e.g., RIE) or wet etch, possibly in combination with any suitable patterning technique, e.g., photolithographic or electron-beam patterning, and/or in combination with using a mask. Dimensions of the signal conductor opening would be substantially as those for the final signal conductor of the vertical buried transmission line.

The method 1000 may then proceed with a process 1012 that includes providing, within the signal conductor opening formed in the process 1010, an electrically conductive material. The conductive material deposited in the signal conductor opening in the process 1012 may be an electrically conductive/superconductive material as one used in the signal conductor 306 described above. In fact, at a final vertical buried transmission line, the conductive material provided within the signal conductor opening in 1012 will form the electrically conductive portion of such a signal conductor. Thus, in various embodiments, the electrically conductive material deposited in 1012 may include any conducting or superconducting material suitable for providing electrical connectivity in a quantum circuit, e.g., Al, Nb, NbN, NbTiN, TiN, MoRe, etc., or any alloy of two or more superconducting/conducting materials. However, in other embodiments, the signal conductor opening could be filled in 1012 with a suitable electrically conductive material (e.g., TiN) only as a liner on the inner sidewalls of the signal conductor opening (i.e. not a complete fill the signal conductor opening), and the rest of the signal conductor opening may be filled with a different material (not shown in FIGS.), e.g., filled with a conductive but not superconductive material e.g., copper, filled with a non-conductive material, or be left unfilled. In various embodiments, the electrically conductive material used to form the signal conductor of a vertical transmission line as described herein may be the same or different from the electrically conductive material used to form its ground conductors.

The signal conductor opening may be filled or lined with the conductive material in 1012 using any suitable techniques for depositing conductive materials, such as ALD, CVD, PECVD, or/and PVD processes e.g., sputter.

Next, the method 1000 may proceed with a process 1014 of etching at least some, preferably all, of the sacrificial material deposited in 1008 to form a cavity surrounding the conductive material of the signal conductor structure. Any suitable etching techniques for removing the sacrificial material without substantially removing the conductive material(s) of the signal and ground conductors, and without substantially etching into the interconnect support layer or the substrate, may be used in the process 1014. In some embodiments, the etch of the process 1014 may advantageously include an isotropic etch (i.e. a process that etches in multiple directions, both vertically and horizontally), e.g., an isotropic wet etch. Any substance suitable for the isotropic etch of the sacrificial material without substantially etching the conductive material(s) of the signal and ground conductors may be used as an etchant in the process 1014. Preferably, the etching of the process 1014 does not substantially etch the surrounding interconnect support layer or the underlying substrate either. In various embodiments, an etchant may be e.g., corrosive liquid, e.g., HF or a chemically active ionized gas (i.e. plasma).

Provided that substantially all of the sacrificial material is etched out in the process 1014, the shape and dimensions of the resulting gap(s) 308 will be those defined by the shape and dimensions of the conductive material forming a signal conductor structure and those of the conductive material forming two ground conductors of a ground structure of the final vertical buried transmission line.

Although not specifically shown in the method 1000 shown in FIG. 10 or in the assemblies of FIGS. 6 and 7, the method may further include a process in which the signal conductor and the two ground conductors of the vertical buried transmission lines as described herein are connected to the respective signal or bias sources—e.g., the signal conductor may be connected to a suitable signal source and the ground conductors may be connected to a ground potential/bias or any other reference potential/bias.

In the embodiments where the fin-based transmission line 310 is implemented, e.g. as discussed with reference to FIG. 8, the method 1000 may be modified accordingly. For example, processes 1008-1014 may be replaced by a process to form a fin within the trench opening, the fin being e.g. as the fin 312 described above, and a subsequent process in which at least portions of the fin 312 are enclosed with a layer of a superconductive material that will form the signal conductor 306, as described above. These two processes may be performed before, after, or at least partially simultaneously with any of the processes 1004 and 1006 described above.

In some embodiments, a process for forming the fin 312 may involve etching the fin out of the material of the substrate 302, e.g. at the time when the trench opening is formed in the process 1002. In such a process, suitable patterning technique may be used to form the trench opening with a fin extending through it.

In other embodiments, a process for forming the fin 312 may involve forming the fin 312 by an additive process once the trench opening has been formed in the process 1002.

The signal conductor 306 may be deposited around at least portion of the fin 312 using any suitable deposition technique, e.g. using any suitable conformal deposition technique, e.g. ALD.

Example Qubit Devices

Quantum circuit assemblies/structures incorporating buried transmission lines or/and buried capacitors as described above may be included in any kind of qubit devices or quantum processing devices/structures. Some examples of such devices/structures are illustrated in FIGS. 11A-11B, 12, and 13.

Figures 11A, 11B:
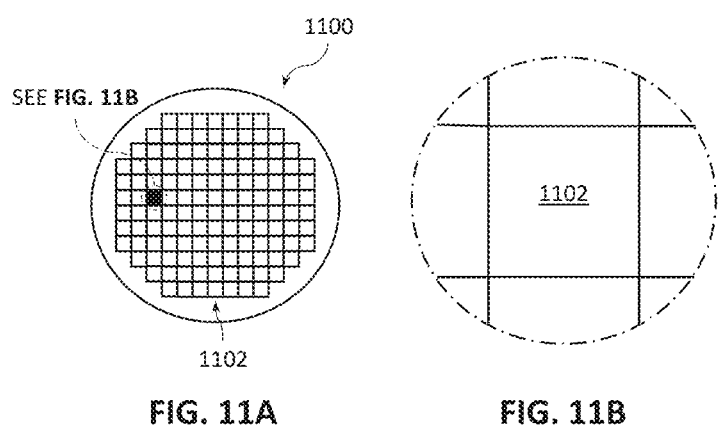
FIGS. 11A and 11B are top views of a wafer and dies that may include one or more quantum circuit assemblies with buried transmission lines or/and capacitors in accordance with various embodiments of the present disclosure.

FIGS. 11A-11B are top views of a wafer 1100 and dies 1102 that may be formed from the wafer 1100, according to some embodiments of the present disclosure. The dies 1102 may include any of the quantum circuit assemblies disclosed herein, e.g., quantum circuit assemblies comprising superconducting qubits, spin qubits, or any combination of various types of qubits, and may include any of the vertical buried transmission lines or/and vertical buried capacitors described herein, e.g., the vertical buried transmission lines described with reference to FIGS. 3-8 or/and vertical capacitors described with reference to FIG. 9, each of which may be implemented according to e.g., at least portions of the method shown in FIG. 10, or any further embodiments of the vertical buried transmission lines or/and buried capacitors as described herein. In particular, the wafer 1100 may be any the form of the qubit substrates as proposed herein, and may further include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include one or more quantum circuit assemblies 100, including any supporting conductive circuitry to route electrical signals within the quantum circuit assemblies 100, as well as any other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 13) or other logic that is configured to store information in the memory devices or execute instructions stored in the memory array.

Figure 12:
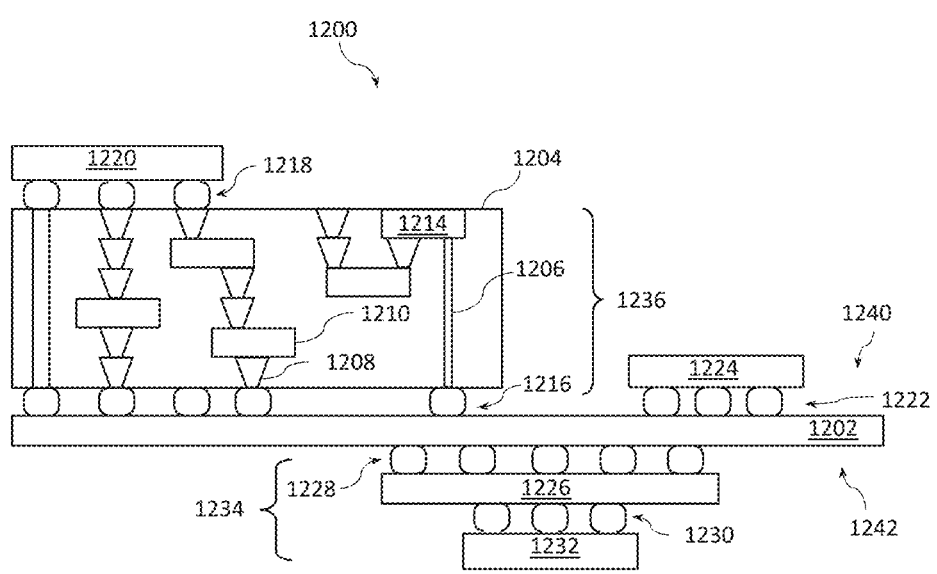
FIG. 12 is a cross-sectional side view of a device assembly that may include one or more quantum circuit assemblies with buried transmission lines or/and capacitors in accordance with various embodiments of the present disclosure.

FIG. 12 is a cross-sectional side view of a device assembly 1200 that may include any of the vertical buried transmission lines or/and buried capacitors disclosed herein, e.g., those described with reference to FIGS. 3-8, or any further embodiments of the vertical buried transmission lines or/and buried capacitors as described herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 12 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 12, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including quantum circuit assemblies with any of the vertical transmission lines described herein, or a combination thereof, or may be a conventional IC package, for example.

In case the package 1220 is a quantum circuit device package including at least one quantum circuit assembly with any of the vertical buried transmission lines or/and buried capacitors described herein, the vertical buried transmission lines or/and buried capacitors therein may be electrically connected to the interposer 1204 by the coupling components 1218. Generally, the interposer 1204 may spread a connection to a wider pitch or reroute a connection to a different connection. For example, the interposer 1204 may couple the package 1220 (e.g., a die) to a BGA of the coupling components 1216 for coupling to the circuit board 1202. In the embodiment illustrated in FIG. 12, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including one or more quantum circuits with qubits as described herein or may be a conventional IC package, for example. In some embodiments, the package 1224 may take the form of any of the embodiments of the quantum circuit with any of the quantum circuit assemblies described herein.

The device assembly 1200 illustrated in FIG. 12 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein, e.g., by including the qubit substrates as described herein, or may be a conventional IC package, for example.

Figure 13:
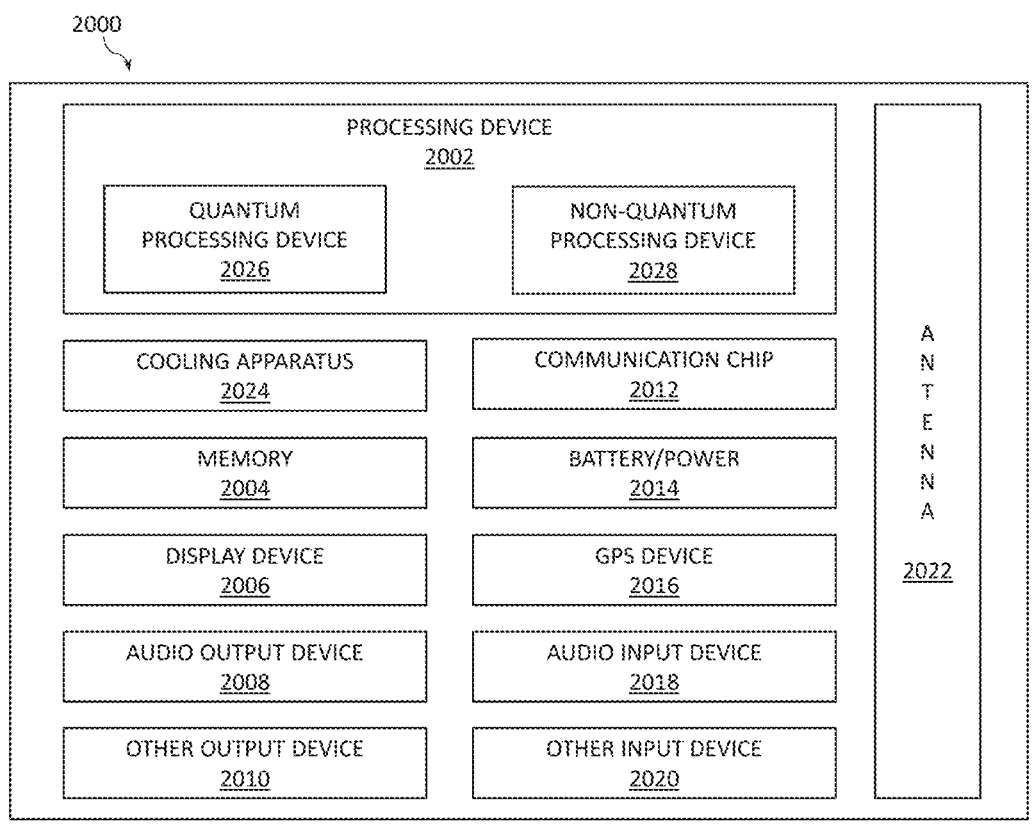
FIG. 13 is a block diagram of an example quantum computing device that may include one or more quantum circuit assemblies with buried transmission lines or/and capacitors in accordance with various embodiments of the present disclosure.

FIG. 13 is a block diagram of an example quantum computing device 2000 that may include any of the quantum circuit assemblies with vertical buried transmission lines or/and buried capacitors as disclosed herein, e.g., those described with reference to FIGS. 3-8, or any further embodiments of the vertical buried transmission lines or/and buried capacitors as described herein. A number of components are illustrated in FIG. 13 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 13, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more quantum circuit assemblies including any of the vertical buried transmission lines or/and buried capacitors disclosed herein, and may perform data processing by performing operations on the qubits that may be generated in the quantum circuit assemblies with any of the vertical transmission lines disclosed herein, and monitoring the result of those operations. For example, different qubits may be allowed to interact, the quantum states of different qubits may be set or transformed, and the quantum states of different qubits may be read, examples of some of which operations have been described above. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed herein, the display device 2006 discussed herein, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuits with any of the vertical transmission lines as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include another output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include another input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide some select examples of various ones of the embodiments disclosed herein.

Example 1 provides a quantum circuit assembly that includes a substrate, at least one qubit, typically a plurality of qubits, provided over or at least partially in the substrate, and a transmission line structure (e.g., a vertical interconnect such as a resonator or a non-resonant transmission line) for providing microwave connectivity for the at least one qubit. The transmission line structure includes at least one conductor having a width measured along a line substantially perpendicular to the plane of the substrate. The at least one conductor further has a length and a thickness measured in a plane substantially parallel to the plane of the substrate, where the width is smaller (e.g., at least 5 times, preferably at least 10 times smaller) than the length, and the thickness is smaller (e.g., at least 2 times, preferably at least 5 times smaller) than the width.

Example 2 provides the quantum circuit assembly according to example 1, where a ratio of the length to the width is greater than a ratio of the width to the thickness.

Example 3 provides the quantum circuit assembly according to examples 1 or 2, where at least a portion of the at least one conductor extends into the substrate (e.g., into an interconnect support layer provided over a starting substrate and forming the upper-portion of the substrate, which interconnect support layer may be a dielectric material, preferably low-loss dielectric material, e.g., a highly crystalline dielectric material e.g., epitaxially deposited silicon).

Example 4 provides the quantum circuit assembly according to example 3, where the portion of the at least one conductor extends into the substrate by a depth (i.e., trench depth) between about 300 nanometers and 10 micrometers, including all values and ranges therein, e.g., between about 500 nm and 5 um, or between about 1 and 2 um.

Example 5 provides the quantum circuit assembly according to any one of examples 1-4, where the transmission line structure further includes a signal conductor separated from the at least one conductor by a gap.

Example 6 provides the quantum circuit assembly according to any one of examples 1-4, where the at least one conductor is a first conductor, the transmission line structure further includes a second conductor, and the transmission line structure further includes a signal conductor between the first conductor and the second conductor, the signal conductor separated from the first conductor by a first gap and separated from the second conductor by a second gap.

Example 7 provides the quantum circuit assembly according to example 6, where the second conductor is substantially parallel to the first conductor (i.e. the first and second conductors may form a parallel-plate structure, with the parallel plates being substantially perpendicular to the plane of the substrate; or, more generally, the shapes of the first and second conductors may be conformal to one another).

Example 8 provides the quantum circuit assembly according to examples 6 or 7, where at least one of the first gap and the second gap (preferably both of the gaps) is between about 20 nanometers and 400 micrometers, including all values and ranges therein, e.g., between about 200 nm and 200 um, or between about 2 and 100 um.

Example 9 provides the quantum circuit assembly according to any one of examples 6-8, where each of the first and second conductors is configured to be connected to a ground potential during operation of the quantum circuit assembly (i.e. the first and second conductors are ground conductors).

Example 10 provides the quantum circuit assembly according to any one of examples 6-9, where the first and second conductors are liners of one or more first electrically conductive, preferably superconductive, materials on inner sidewalls of an opening in the substrate or in an interconnect support layer provided over a starting substrate and forming the upper-portion of the substrate, which interconnect support layer may be a dielectric material, preferably low-loss dielectric material, e.g., a highly crystalline dielectric material e.g., epitaxially deposited silicon.

Example 11 provides the quantum circuit assembly according to any one of the preceding examples, where the width is between about 50 nanometers and 1000 micrometers, including all values and ranges therein, e.g., between about 300 nm and 500 um, or between 500 nm and 200 um.

Example 12 provides the quantum circuit assembly according to any one of the preceding examples, where the length is greater than about 250 nanometers, including all values and ranges therein, e.g., greater than about 500 nm.

Example 13 provides the quantum circuit assembly according to any one of the preceding examples, where the thickness is between about 25 nanometers and 500 micrometers, including all values and ranges therein, e.g., between about 150 nm and 250 um, or between 250 nm and 100 um.

Example 14 provides the quantum circuit assembly according to any one of the preceding examples, where the at least one qubit is a superconducting qubit, e.g., a transmon qubit.

Example 15 provides the quantum circuit assembly according to any one of the preceding examples, where the at least one qubit includes a superconducting quantum interference device (SQUID) including two or more Josephson Junctions connected by a superconductor loop.

Example 16 provides the quantum circuit assembly according to any one of examples 1-15, where the transmission line structure is a coupling resonator, configured to couple the at least one qubit to one or more further qubits.

Example 17 provides the quantum circuit assembly according to any one of examples 1-15, where the transmission line structure is a readout resonator, configured to detect (readout) a state of the at least one qubit by capacitively coupling, during operation of the quantum circuit assembly, to a portion of the at least one qubit.

Example 18 provides the quantum circuit assembly according to any one of examples 1-15, where the transmission line structure is a microwave drive line, configured to set a state of the at least one qubit by capacitively coupling, during operation of the quantum circuit assembly, to a portion of the at least one qubit.

Example 19 provides the quantum circuit assembly according to any one of examples 1-15, where the transmission line structure is a flux bias line, configured to control a frequency of the at least one qubit by providing electromagnetic fields which couple to the at least one non-linear inductive element of the at least one qubit.

Example 20 provides the quantum circuit assembly according to any one of the preceding examples, where the at least one conductor is a superconductor.

Example 21 provides a quantum circuit assembly that includes a substrate; at least one qubit over or at least partially in the substrate; and at least one capacitor, including a first capacitor electrode and a second capacitor electrode (each plate is a layer-conductor). Each of the first capacitor electrode and the second capacitor electrode may be substantially perpendicular to the substrate.

In some embodiments, the second capacitor electrode may be parallel to the first capacitor electrode (thus, the capacitor may be a "parallel-plate capacitor" because capacitor electrodes lie in parallel planes separated by a gap).

Example 22 provides the quantum circuit assembly according to example 21, where the first capacitor electrode is separated from the second capacitor electrode by a dielectric medium.

Example 23 provides the quantum circuit assembly according to example 22, where the dielectric medium is gaseous (e.g., air) or a vacuum (i.e. the first and second capacitor electrodes are separated by a gap).

Example 24 provides the quantum circuit assembly according to any one of examples 21-23, where a distance between the first capacitor electrode and the second capacitor electrode is between about 20 nanometers and 1 micrometer, including all values and ranges therein, e.g., between about 40 and 500 nm, or between about 50 and 100 nm.

Example 25 provides the quantum circuit assembly according to any one of examples 21-24, where the at least one qubit includes at least one non-linear inductive element (e.g., at least one Josephson Junction).

Example 26 provides the quantum circuit assembly according to example 25, where the at least one non-linear inductive element includes a superconducting quantum interference device (SQUID) including two or more Josephson Junctions connected by a superconductor loop.

Example 27 provides the quantum circuit assembly according to examples 25 or 26, where the at least one capacitor is a shunt capacitor, connected in electrical parallel to the at least one non-linear inductive element.

Example 28 provides the quantum circuit assembly according to any one of examples 21-27, where at least one of the first capacitor electrode and the second capacitor electrode has a width measured along a line substantially perpendicular to the plane of the substrate, a length measured along a first line substantially parallel to the plane of the substrate, and a thickness measured along a second line substantially parallel to the plane of the substrate and substantially perpendicular to the first line, where the width is smaller (e.g., at least 5 times, preferably at least 10 times smaller) than the length, and the thickness is smaller (e.g., at least 2 times, preferably at least 5 times smaller) than the width.

Example 29 provides the quantum circuit assembly according to example 28, where a ratio of the length to the width is greater than a ratio of the width to the thickness.

Example 30 provides the quantum circuit assembly according to examples 28 or 29, where at least a portion of the at least one of the first capacitor electrode and the second capacitor electrode extends into the substrate.

Example 31 provides the quantum circuit assembly according to example 30, where the portion of the at least one of the first capacitor electrode and the second capacitor electrode extends into the substrate by a depth (i.e., trench depth) between about 300 nanometers and 10 micrometers, including all values and ranges therein, e.g., between about 500 nanometers and 5 micrometers, or between about 1 and 2 micrometers.

Example 32 provides the quantum circuit assembly according to any one of examples 28-31, where the width is between about 50 nanometers and 1000 micrometers, including all values and ranges therein, e.g., between about 300 nm and 500 um, or between 500 nm and 200 um.

Example 33 provides the quantum circuit assembly according to any one of examples 28-32, where the length is greater than about 250 nanometers, including all values and ranges therein, e.g., greater than about 500 nanometers.

Example 34 provides the quantum circuit assembly according to any one of examples 28-33, where the thickness is between about 25 nanometers and 500 micrometers, including all values and ranges therein, e.g., between about 150 nm and 250 um, or between 250 nm and 100 um.

Example 35 provides the quantum circuit assembly according to any one of examples 21-34, where the first capacitor electrode and the second capacitor electrode are liners of electrically conductive, preferably superconductive, material on inner sidewalls of an opening in the substrate or in an interconnect support layer provided over the substrate, which interconnect support layer may be a dielectric material, preferably low-loss dielectric material, e.g., a highly crystalline dielectric material e.g., epitaxially deposited silicon.

Example 36 provides a method of manufacturing a quantum assembly, the method including providing an opening in an interconnect support layer over a substrate; depositing a liner of a first electrically conductive material on sidewalls and bottom of the opening; depositing a sacrificial material in the opening with the liner; forming an opening in the sacrificial material; depositing a second electrically conductive material within the opening in the sacrificial material; removing some or all of the sacrificial material around the second electrically conductive material to form a transmission line structure; and providing one or more qubits associated with the vertical transmission line structure. The formed transmission line structure includes a ground structure, including two substantially parallel ground planes formed of the first electrically conductive material, and a signal conductor, formed of the second electrically conductive material and provided between the two parallel ground planes.

Example 37 provides the method according to example 36, where each of the two parallel ground planes is separated from the signal conductor by an individual gap.

Example 38 provides the method according to example 37, where the individual gap is a region where the sacrificial material between the first and the second electrically conductive materials is removed.

Example 39 provides the method according to any one of examples 36-38, where depositing the liner includes performing atomic layer deposition.

Example 40 provides the method according to any one of examples 36-39, where at least one of a first ground plane of the two ground planes, a second ground plane of the two ground planes, and the signal conductor has a width measured along a line substantially perpendicular to the plane of the substrate, a length measured along a first line substantially parallel to the plane of the substrate, and a thickness measured along a second line substantially parallel to the plane of the substrate and substantially perpendicular to the first line, where the width is smaller (e.g., at least 5 times, preferably at least 10 times smaller) than the length, and the thickness is smaller (e.g., at least 2 times, preferably at least 5 times smaller) than the width.

Example 41 provides the method according to example 40, where a ratio of the length to the width is greater than a ratio of the width to the thickness.

Example 42 provides the method according to examples 40 or 41, where at least a portion of the at least one of the first ground plane of the two ground planes, the second ground plane of the two ground planes, and the signal conductor extends into the substrate.

Example 43 provides the quantum circuit assembly according to example 42, where the portion of the at least one of the first ground plane of the two ground planes, the second ground plane of the two ground planes, and the signal conductor extends into the substrate by a depth (i.e., trench depth) between about 300 nanometers and 10 micrometers, including all values and ranges therein, e.g., between about 500 nanometers and 5 micrometers, or between about 1 and 2 micrometers.

In various further examples, the method according to any one of the preceding examples may include processes for manufacturing the quantum circuit assembly according to any one of examples 1-20, with the ground structure and the signal conductor of the method according to any one of examples 36-43 forming the transmission line structure of the quantum circuit assembly according to any one of examples 1-20.

In addition, in various further examples, the method according to any one of the preceding examples may be easily modified to manufacture other quantum assemblies described herein. For example, to manufacture a transmission line structure with only one of the ground planes as described herein, the method may be modified by either depositing the first conductive material only on one wall of an opening, or by depositing it as described above and then removing the material from some of the walls so that one ground plane is formed at the end.

In still further examples, the method described above may also be modified to form a parallel-plate capacitor as described herein, instead of the transmission line structure, by e.g., omitting the steps for forming the signal conductor in the method described above. For example, in such further examples, the method according to any one of the preceding examples may be modified to include processes for manufacturing the quantum circuit assembly according to any one of examples 21-35, except that the ground structure of the method according to any one of examples 36-43 would become the first and second capacitor electrodes of the capacitor of the quantum circuit assembly according to any one of examples 21-35.

Example 44 provides a quantum circuit assembly that includes a substrate, at least one qubit device over or at least partially in the substrate, and an opening in the substrate, the opening having a first layer including one or more superconductive materials provided on a first sidewall within the opening, and a second layer including one or more superconductive materials provided on a second sidewall within the opening, the first layer separated from the second layer by a dielectric medium.

Example 45 provides the quantum circuit assembly according to example 44, where the first layer and the second layer form a non-resonant transmission line structure (e.g. a microwave transmission line) for providing electrical (e.g. microwave) connectivity for the at least one qubit device.

Example 46 provides the quantum circuit assembly according to example 45, where the non-resonant transmission line is a microwave drive line, configured to set a state of the at least one qubit device by capacitively coupling, during operation of the quantum circuit assembly, to a portion of the at least one qubit device.

Example 47 provides the quantum circuit assembly according to example 45, where the non-resonant transmission line is a flux bias line, configured to control a frequency of the at least one qubit device by providing electromagnetic fields which couple to the at least one non-linear inductive element of the at least one qubit device.

Example 48 provides the quantum circuit assembly according to example 44, where the first layer and the second layer form a resonator associated with the at least one qubit device.

Example 49 provides the quantum circuit assembly according to example 48, where the resonator is a coupling resonator, configured to couple the at least one qubit device to one or more further qubit devices.

Example 50 provides the quantum circuit assembly according to example 48, where the resonator is a readout resonator, configured to detect (readout) a state of the at least one qubit device by capacitively coupling, during operation of the quantum circuit assembly, to a portion of the at least one qubit device.

Example 51 provides the quantum circuit assembly according to any one of examples 44-50, where, during operation of the quantum circuit assembly, the first layer is connected to a ground potential and the second layer is connected to a signal source.

Example 52 provides the quantum circuit assembly according to example 44, where the first layer forms a first capacitor plate and the second layer forms a second capacitor plate of a capacitor associated with the at least one qubit device (such a capacitor may be referred to as a "vertical capacitor" because its' first and second plates are provided on sidewalls of the opening, i.e. are substantially vertical/perpendicular with respect to the substrate).

Example 53 provides the quantum circuit assembly according to example 52, where the capacitor is a shunt capacitor of the at least one qubit device.

Example 54 provides the quantum circuit assembly according to example 53, where the at least one qubit device includes at least one non-linear inductive element (e.g. at least one Josephson Junction), during operation of the quantum circuit assembly, the shunt capacitor and the at least one non-linear inductive element are connected in electrical parallel.

Example 55 provides the quantum circuit assembly according to example 54, where the at least one non-linear inductive element includes a superconducting quantum interference device (SQUID) including two or more Josephson Junctions connected by a superconductor loop.

Example 56 provides the quantum circuit assembly according to example 52, where the capacitor is a coupling capacitor configured to couple the at least one qubit device to a further qubit device.

Example 57 provides the quantum circuit assembly according to any one of examples 44-56, where the at least one qubit device is a superconducting qubit device, e.g. a transmon qubit device.

Example 58 provides the quantum circuit assembly according to any one of examples 44-57, where the opening is a trench.

Example 59 provides the quantum circuit assembly according to any one of examples 44-58, where an aspect ratio of the opening (i.e. a ratio of a width of the opening to a depth of the opening) is between about 0.05 and 10, including all values and ranges therein, e.g. between about 0.01 and 5, or between about 0.1 and 4.

Example 60 provides the quantum circuit assembly according to any one of examples 44-59, where a cross-sectional profile of the opening is substantially rectangular. In other examples, the cross-sectional profile of the opening may be substantially trapezoidal. Whether the cross-sectional profile of the opening is substantially rectangular or substantially trapezoidal, in various further examples, such an opening may have rounded corners.

Example 61 provides the quantum circuit assembly according to any one of examples 44-60, where a thickness of at least one of, e.g. of each of the first layer and the second layer is between about 25 nanometers and 500 micrometers, including all values and ranges therein, e.g. between about 150 nm and 250 um, or between 250 nm and 100 um.

In some examples of the quantum circuit assembly according to any one of examples 44-61, the one or more superconductive materials of the first layer may be the same as the one or more superconductive materials of the second layer. In other examples, these superconductive materials may be different.

Example 62 provides a quantum circuit assembly that includes a substrate, at least one qubit device over or at least partially in the substrate, and an opening in the substrate, the opening having a fin that extends from a bottom of the opening and is separated from each of a first sidewall and a second sidewall of the opening by a dielectric medium, where a first layer including one or more superconductive materials is provided on the first sidewall of the opening, a second layer including one or more superconductive materials is provided on a second sidewall of the opening, and a third layer including one or more superconductive materials is provided on at least one sidewall of the fin.

Example 63 provides the quantum circuit assembly according to example 62, where the third layer is provided on both sidewalls of the fin.

Example 64 provides the quantum circuit assembly according to examples 62 or 63, where the third layer wraps around at least an upper portion of the fin.

Example 65 provides the quantum circuit assembly according to examples 63 or 64, where a distance between the first layer and a portion of the third layer provided over a sidewall of the fin closest to the first layer is between about 20 nanometers and 400 micrometers, including all values and ranges therein, e.g. between about 200 nanometers and 200 micrometers, or between about 2 and 100 micrometers. In a further example, a distance between the second layer and a portion of the third layer provided over a sidewall of the fin closest to the second layer is in the same ranges.

Example 66 provides the quantum circuit assembly according to any one of examples 62-65, where a width of the fin is between about 10 nanometers and 100 micrometers, including all values and ranges therein, e.g. between about 40 nanometers and 40 micrometers.

Example 67 provides the quantum circuit assembly according to any one of examples 62-66, where a ratio of a height of the fin to a depth of the opening is between about 0.6 and 1, including all values and ranges therein, e.g. between about 0.7 and 0.95, or between about 0.8 and 1.

Example 68 provides the quantum circuit assembly according to any one of examples 62-67, where, during operation of the quantum circuit assembly, each of the first layer and the second layer is connected to a ground potential, and the third layer is connected to a signal source.

Example 69 provides the quantum circuit assembly according to any one of examples 62-68, where the first layer, the second layer, and the third layer form a non-resonant transmission line structure (e.g. a microwave transmission line) for providing electrical (e.g. microwave) connectivity for the at least one qubit device.

Example 70 provides the quantum circuit assembly according to example 69, where the non-resonant transmission line is a microwave drive line, configured to set a state of the at least one qubit device by capacitively coupling, during operation of the quantum circuit assembly, to a portion of the at least one qubit device.

Example 71 provides the quantum circuit assembly according to example 69, where the non-resonant transmission line is a flux bias line, configured to control a frequency of the at least one qubit device by providing electromagnetic fields which couple to the at least one non-linear inductive element of the at least one qubit device.

Example 72 provides the quantum circuit assembly according to any one of examples 62-68, where the first layer, the second layer, and the third layer form a resonator associated with the at least one qubit device.

Example 73 provides the quantum circuit assembly according to example 72, where the resonator is a coupling resonator, configured to couple the at least one qubit device to one or more further qubit devices.

Example 74 provides the quantum circuit assembly according to example 72, where the resonator is a readout resonator, configured to detect (readout) a state of the at least one qubit device by capacitively coupling, during operation of the quantum circuit assembly, to a portion of the at least one qubit device.

Example 75 provides the quantum circuit assembly according to any one of examples 62-74, where the at least one qubit device includes at least one non-linear inductive element.

Example 76 provides the quantum circuit assembly according to example 75, where the at least one non-linear inductive element includes a SQUID including two or more Josephson Junctions connected by a superconductor loop.

Example 77 provides the quantum circuit assembly according to any one of examples 62-76, where the at least one qubit device is a superconducting qubit device, e.g. a transmon qubit device.

Example 78 provides the quantum circuit assembly according to any one of examples 62-77, where the opening is a trench.

Example 79 provides the quantum circuit assembly according to example 78, where the fin extends along a length of the trench.

Example 80 provides the quantum circuit assembly according to any one of examples 62-79, where a thickness of at least one of, e.g. of each of the first layer, the second layer, and the third layer is between about 25 nanometers and 500 micrometers, including all values and ranges therein, e.g. between about 150 nm and 250 um, or between 250 nm and 100 um.

In various examples of the quantum circuit assembly according to any one of examples 62-80, the superconductive materials of the first, second, and third layers may be the same or different materials.

Example 81 provides a quantum IC package that includes a qubit die, including a quantum circuit assembly according to any one of examples 1-35 or any one of examples 44-80; and a further IC element, coupled to the qubit die.

Example 82 provides the quantum IC package according to example 81, where the further IC element is coupled to the qubit die by first level interconnects.

Example 83 provides the quantum IC package according to examples 81 or 82, where the further IC element is one of an interposer, a circuit board, a flexible board, or a package substrate.

Example 84 provides a quantum computing device, including a quantum processing device that includes a quantum IC package including a plurality of qubits, the quantum IC package being Example provides the quantum IC package according to any one of examples 81-83; and a memory device configured to store data generated by the plurality of qubits during operation of the quantum processing device.

Example 85 provides the quantum computing device according to example 84, further including a cooling apparatus configured to maintain a temperature of the quantum processing device below 5 degrees Kelvin.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum circuit assembly comprising:
   a substrate;
   at least one qubit device over or at least partially in the substrate; and
   an opening in the substrate, comprising a fin that extends from a bottom of the opening and is separated from each of a first sidewall and a second sidewall of the opening by a dielectric medium,
   wherein a first layer comprising one or more superconductive materials is provided on the first sidewall of the opening, a second layer comprising one or more superconductive materials is provided on a second sidewall of the opening, and a third layer comprising one or more superconductive materials is provided on at least one sidewall of the fin.

2. The quantum circuit assembly according to claim 1, wherein:
   the third layer is provided on both sidewalls of the fin, or
   the third layer wraps around at least an upper portion of the fin.

3. The quantum circuit assembly according to claim 1, wherein a ratio of a height of the fin to a depth of the opening is between 0.6 and 1.

4. The quantum circuit assembly according to claim 1, wherein, during operation of the quantum circuit assembly, each of the first layer and the second layer is connected to a ground potential, and the third layer is connected to a signal source.

5. The quantum circuit assembly according to claim 1, wherein the first layer, the second layer, and the third layer form a non-resonant transmission line for the at least one qubit device.

6. The quantum circuit assembly according to claim 1, wherein the opening is a trench, and wherein the fin extends along a length of the trench.

7. A method of manufacturing a quantum assembly, the method comprising:
   providing an opening in an interconnect support layer over a substrate;
   depositing a liner of a first electrically conductive material on sidewalls and bottom of the opening;
   depositing a sacrificial material in the opening with the liner;
   forming an opening in the sacrificial material;
   depositing a second electrically conductive material within the opening in the sacrificial material;
   removing some or all of the sacrificial material around the second electrically conductive material to form a transmission line structure that includes:
      a ground structure, comprising two parallel ground planes formed of the first electrically conductive material, and
      a signal conductor, formed of the second electrically conductive material and provided between the two parallel ground planes; and
   providing one or more qubit devices associated with the vertical transmission line structure.

8. A quantum circuit assembly, comprising:
   a qubit die that includes at least one qubit device and at least one conductor, coupled to the at least one qubit device,
   wherein:
      the at least one conductor has a width measured along a line substantially perpendicular to the qubit die,
      the at least one conductor has a length and a thickness measured in a plane substantially parallel to the qubit die,
      the width is at least 5 times smaller than the length, and
      the thickness is at least 2 times smaller than the width.

9. The quantum circuit assembly according to claim 8, wherein:
   the at least one conductor is a first conductor,
   the quantum circuit assembly further includes a second conductor,
   the second conductor is parallel to the first conductor and is separated from the first conductor by a dielectric medium.

10. The quantum circuit assembly according to claim 9, wherein:
the second conductor has a width measured along a line substantially perpendicular to the qubit die,
the second conductor has a thickness measured in a plane substantially parallel to the qubit die, and
the thickness of the second conductor is at least 2 times smaller than the width.

11. The quantum circuit assembly according to claim 10, wherein:
the second conductor has a length measured in a plane substantially parallel to the qubit die, and
the width of the second conductor is at least 5 times smaller than the length of the second conductor.

12. The quantum circuit assembly according to claim 11, wherein the width of the second conductor is different from the width of the first conductor.

13. The quantum circuit assembly according to claim 9, wherein the first conductor is a first capacitor electrode of a capacitor and the second conductor is a second capacitor electrode of the capacitor.

14. The quantum circuit assembly according to claim 13, wherein the capacitor is a shunt capacitor of the at least one qubit device.

15. The quantum circuit assembly according to claim 8, wherein the quantum circuit assembly is a quantum integrated circuit (IC) package, and the quantum IC package further includes a further IC element, coupled to the qubit die.

16. The quantum circuit assembly according to claim 15, wherein the further IC element is one of an interposer, a circuit board, a flexible board, or a package substrate.

17. The quantum circuit assembly according to claim 8, wherein the at least one conductor is a part of a transmission line structure for providing electrical connectivity for the at least one qubit device.

18. The quantum circuit assembly according to claim 8, wherein the at least one conductor is a part of:
a microwave drive line, configured to set a state of the at least one qubit device, or
a flux bias line, configured to control a frequency of the at least one qubit device.

19. The quantum circuit assembly according to claim 8, wherein the at least one conductor is a part of a resonator associated with the at least one qubit device.

20. A quantum circuit assembly comprising:
a qubit die that includes at least one qubit device, a first conductor, and a second conductor,
wherein:
each of the first conductor and the second conductor has a respective width measured along a respective line substantially perpendicular to the qubit die,
each of the first conductor and the second conductor has a respective thickness measured in a respective plane substantially parallel to the qubit die,
the thickness of the first conductor is at least 2 times smaller than the width of the first conductor, and
the width of the first conductor is smaller than the width of the second conductor.

21. The quantum circuit assembly according to claim 20, wherein the first conductor is a first capacitor electrode of a capacitor and the second conductor is a second capacitor electrode of the capacitor.

22. The quantum circuit assembly according to claim 21, wherein the capacitor is a shunt capacitor of the at least one qubit device.

23. The quantum circuit assembly according to claim 20, wherein:
each of the first conductor and the second conductor has a respective length measured in a respective plane substantially parallel to the qubit die, and
the width of the first conductor is at least 5 times smaller than the length of the first conductor.

24. The quantum circuit assembly according to claim 23, wherein, during operation of the quantum circuit assembly, the first conductor is connected to a ground potential, and the second conductor is connected to a signal source.

25. The quantum circuit assembly according to claim 20, wherein:
the quantum circuit assembly is a quantum integrated circuit (IC) package,
the quantum IC package further includes a further IC element, coupled to the qubit die, and
the further IC element is one of an interposer, a circuit board, a flexible board, or a package substrate.

* * * * *